US008890740B2

(12) United States Patent
Hoshino et al.

(10) Patent No.: US 8,890,740 B2

(45) Date of Patent: Nov. 18, 2014

(54) COMPARATOR AND CORRECTION METHOD THEREFOR

(71) Applicants: Fujitsu Limited, Kawasaki (JP); Fujitsu Semiconductor Limited, Yokohama (JP)

(72) Inventors: Masanori Hoshino, Suginami (JP); Takumi Danjo, Kawasaki (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/069,046

(22) Filed: Oct. 31, 2013

(65) Prior Publication Data

US 2014/0152482 A1 Jun. 5, 2014

(30) Foreign Application Priority Data

Nov. 30, 2012 (JP) ................................ 2012-262499

(51) Int. Cl.

*H03M 1/36* (2006.01)
*H03M 1/12* (2006.01)
*H03L 5/00* (2006.01)

(52) U.S. Cl.

CPC .. *H03L 5/00* (2013.01); *H03M 1/12* (2013.01)
USPC ........... 341/159; 341/118; 341/120; 341/155; 341/158; 341/160

(58) Field of Classification Search

USPC ......... 341/118, 120, 134, 135, 136, 155, 159, 341/160
See application file for complete search history.

(56) References Cited

U.S. PATENT DOCUMENTS

| | | | | |
|---|---|---|---|---|
| 6,445,218 | B1 * | 9/2002 | Lee | 327/65 |
| 6,531,907 | B2 * | 3/2003 | Dooley et al. | 327/307 |
| 6,617,887 | B2 * | 9/2003 | Nix | 327/65 |
| 7,652,600 | B2 * | 1/2010 | Van der Plas et al. | 341/120 |
| 7,733,168 | B2 * | 6/2010 | Higuchi | 330/9 |
| 8,362,934 | B2 * | 1/2013 | Matsuzawa et al. | 341/118 |
| 8,373,587 | B2 * | 2/2013 | Tsukamoto | 341/159 |
| 8,537,241 | B2 * | 9/2013 | Ayers et al. | 348/229.1 |
| 2009/0195424 | A1 * | 8/2009 | Van Der Plas et al. | 341/120 |
| 2009/0267653 | A1 * | 10/2009 | Ambo et al. | 327/94 |
| 2011/0215959 | A1 * | 9/2011 | Matsuzawa et al. | 341/160 |
| 2014/0132437 | A1 * | 5/2014 | Danjo | 341/159 |

FOREIGN PATENT DOCUMENTS

| | | |
|---|---|---|
| JP | 2010-50590 A | 3/2010 |
| JP | 2012-39548 A | 2/2012 |
| JP | 2013-70156 A | 4/2013 |

* cited by examiner

*Primary Examiner* — Linh Nguyen

(74) *Attorney, Agent, or Firm* — Arent Fox LLP

(57) ABSTRACT

A comparator has a comparator circuit to output an output voltage based on a voltage difference between a first and second input voltage, a variable capacitor connected to an output terminal, an input voltage control circuit to generate a common voltage and add the common voltage to the first and the second input voltages, and a correction circuit to control the variable capacitor to control the common voltage. The correction circuit controls a first capacitance value of the variable capacitor so that the output voltage is reversed when the voltage difference equals a first voltage difference, and controls a second capacitance value of the variable capacitor so that the output voltage is reversed when the voltage difference equals a second voltage value, and controls the common voltage so that a difference between the first capacitance value and the second capacitance value becomes equal to a predetermined capacitance value.

15 Claims, 24 Drawing Sheets

COMP VDD CS OP ON Sa Sb Sc Sd P1 P2 D1 D2 N1 N2 D3 D4 N3 N4 D5 VIP VIN T1 T2 Se GND /CS CPm CP2 CP1 CN1 CN2 CNm SPm SP2 SP1 SN1 SN2 SNm 101 102 CPam CPa2 CPa1 CNa1 CNa2 CNam 100 SWITCH CONTROL CIRCUIT

COMP
102
101
100
SWITCH CONTROL CIRCUIT
VDD
CS
/CS
OP
ON
Sa
Sb
Sc
Sd
Se
P1
P2
N1
N2
N3
N4
D1
D2
D3
D4
D5
VIP
VIN
T1
T2
GND
CP1
CP2
CPm
SP1
SP2
SPm
CN1
CN2
CNm
SN1
SN2
SNm
CPa1
CPa2
CPam
CNa1
CNa2
CNam

20
CONTROL CIRCUIT
21
VOP
CNa11~CNa1m
CPa11~CPa1m
COMP
CONT1
CONT2
CONT3
VIP
VIN
T1
T2
SW6
Vcm
SW5
COMMON VOLTAGE GENERATOR CIRCUIT
22
C1
C2
23
GND
SW3
SW4
GND
SW1
SW2
24
DIFFERENTIAL VOLTAGE GENERATOR CIRCUIT
INN
Vd
INP

THRESHOLD VOLTAGE Vd
COMP1
(Vcm = 600mV)
OP SIDE
SWITCH-ON
COUNT
ON SIDE
m
a2(Ct2)
Δa
a1(Ct1)
Vt1
0
Vt2
Voff1
-m

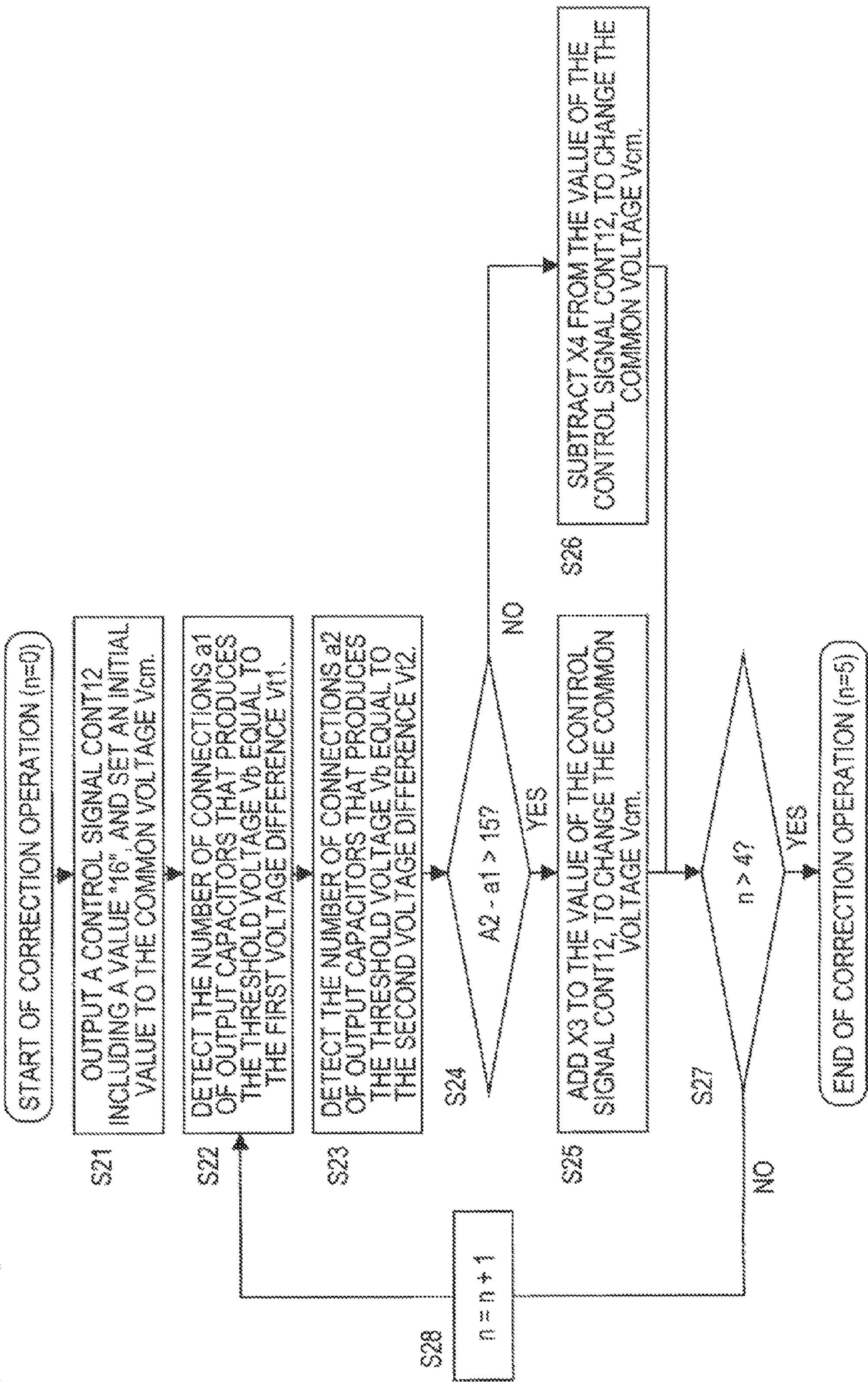
FIG. 16
START OF CORRECTION OPERATION (n=0)
S21
OUTPUT A CONTROL SIGNAL CONT12 INCLUDING A VALUE "16", AND SET AN INITIAL VALUE TO THE COMMON VOLTAGE Vcm.
S22
DETECT THE NUMBER OF CONNECTIONS a1 OF OUTPUT CAPACITORS THAT PRODUCES THE THRESHOLD VOLTAGE Vb EQUAL TO THE FIRST VOLTAGE DIFFERENCE Vt1.
S23
DETECT THE NUMBER OF CONNECTIONS a2 OF OUTPUT CAPACITORS THAT PRODUCES THE THRESHOLD VOLTAGE Vb EQUAL TO THE SECOND VOLTAGE DIFFERENCE Vt2.
S24
A2 - a1 > 15?
YES
NO
S25
ADD X3 TO THE VALUE OF THE CONTROL SIGNAL CONT12, TO CHANGE THE COMMON VOLTAGE Vcm.
S26
SUBTRACT X4 FROM THE VALUE OF THE CONTROL SIGNAL CONT12, TO CHANGE THE COMMON VOLTAGE Vcm.
S27
n > 4?
YES
NO
S28
n = n + 1
END OF CORRECTION OPERATION (n=5)

FIG. 17

| CONT12 | Vcm (mV) |
|---|---|
| 0 | 520 |
| 1 | 525 |
| 2 | 530 |
| 3 | 535 |
| 4 | 540 |
| 5 | 545 |
| 6 | 550 |
| 7 | 555 |
| 8 | 560 |
| 9 | 565 |
| 10 | 570 |
| 11 | 575 |
| 12 | 580 |
| 13 | 585 |
| 14 | 590 |
| 15 | 595 |

| CONT12 | Vcm (mV) |
|---|---|
| 16 | 600 |
| 17 | 605 |
| 18 | 610 |
| 19 | 620 |
| 20 | 625 |
| 21 | 630 |
| 22 | 635 |
| 23 | 640 |
| 24 | 645 |
| 25 | 650 |
| 26 | 655 |
| 27 | 660 |
| 28 | 665 |
| 29 | 670 |
| 30 | 675 |
| 31 | 680 |

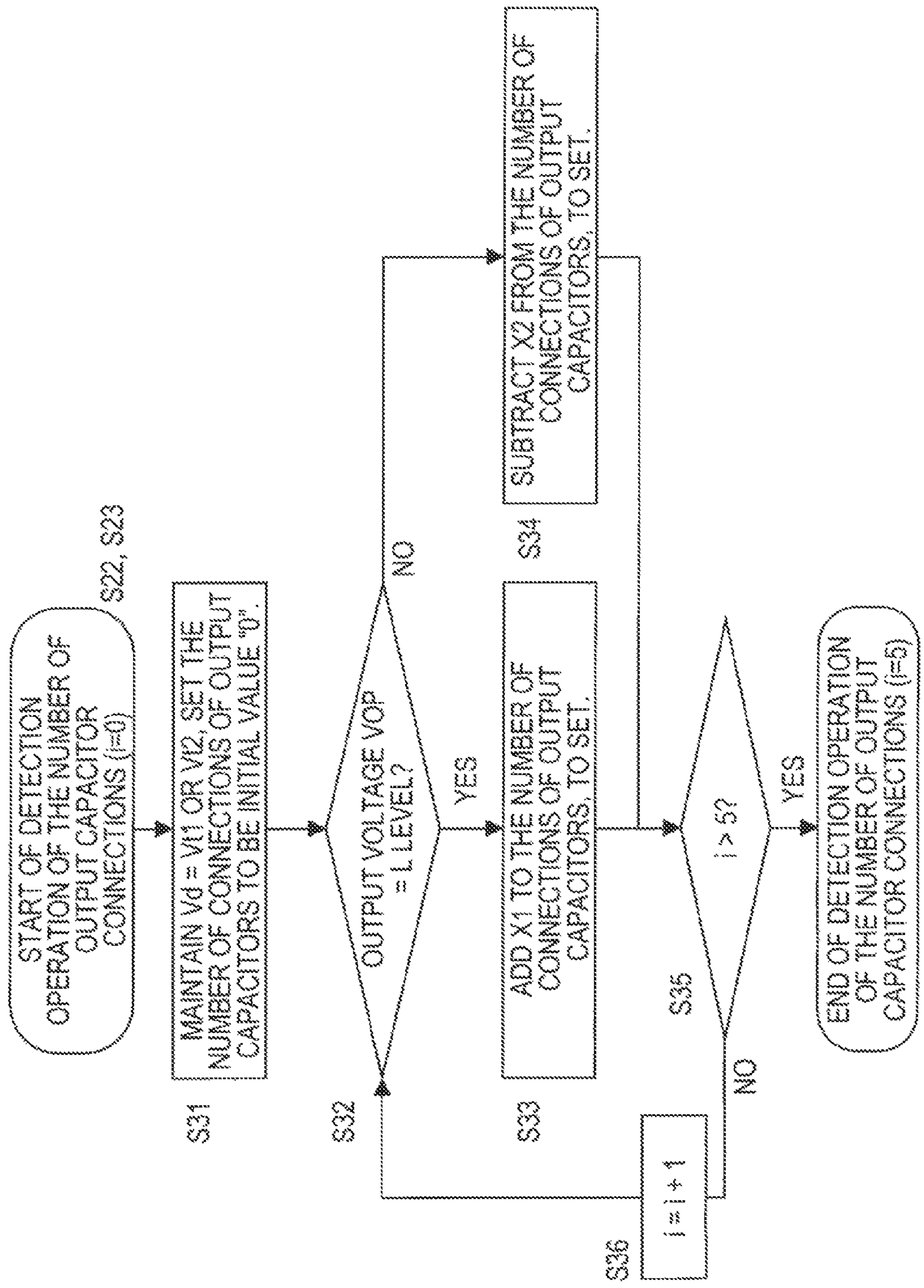
FIG. 18
START OF DETECTION OPERATION OF THE NUMBER OF OUTPUT CAPACITOR CONNECTIONS (i=0)
S22, S23
S31
MAINTAIN Vd = Vt1 OR Vt2, SET THE NUMBER OF CONNECTIONS OF OUTPUT CAPACITORS TO BE INITIAL VALUE "0".
S32
OUTPUT VOLTAGE VOP = L LEVEL?
YES
NO
S33
ADD X1 TO THE NUMBER OF CONNECTIONS OF OUTPUT CAPACITORS, TO SET.
S34
SUBTRACT X2 FROM THE NUMBER OF CONNECTIONS OF OUTPUT CAPACITORS, TO SET.
S35
i > 5?
YES
NO
S36
i = i + 1
END OF DETECTION OPERATION OF THE NUMBER OF OUTPUT CAPACITOR CONNECTIONS (i=5)

FIG. 19

| NUMBER OF EXECUTION TIMES i (TIMES) | X1 (OUTPUT VOLTAGE VOP = L) | X2 (OUTPUT VOLTAGE VOP ≠ L) |
|---|---|---|
| 0 | 16 | 16 |
| 1 | 8 | 8 |
| 2 | 4 | 4 |
| 3 | 2 | 2 |
| 4 | 1 | 1 |
| 5 | 0 | 1 |

| NUMBER OF EXECUTION TIMES n (TIMES) | X3 (a2 - a1 > 15) | X4 (a2 - a1 ≦ 15) |
|---|---|---|
| 0 | 8 | 8 |
| 1 | 4 | 4 |
| 2 | 2 | 2 |
| 3 | 1 | 1 |
| 4 | 0 | 1 |

FIG. 20

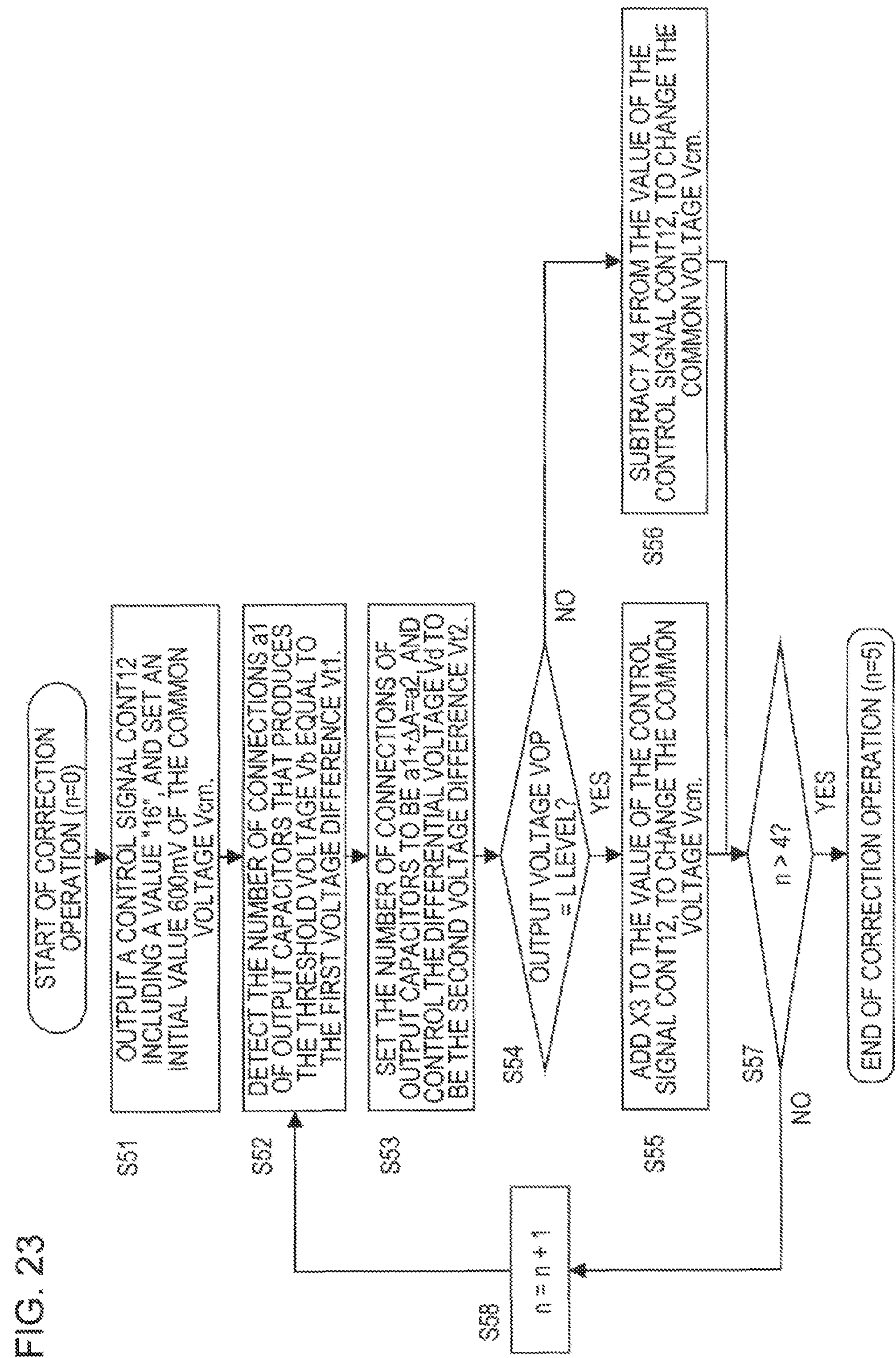
FIG. 23
START OF CORRECTION OPERATION (n=0)
S51
OUTPUT A CONTROL SIGNAL CONT12 INCLUDING A VALUE "16", AND SET AN INITIAL VALUE 600mV OF THE COMMON VOLTAGE Vcm.
S52
DETECT THE NUMBER OF CONNECTIONS a1 OF OUTPUT CAPACITORS THAT PRODUCES THE THRESHOLD VOLTAGE Vb EQUAL TO THE FIRST VOLTAGE DIFFERENCE Vt1.
S53
SET THE NUMBER OF CONNECTIONS OF OUTPUT CAPACITORS TO BE a1+ΔA=a2, AND CONTROL THE DIFFERENTIAL VOLTAGE Vd TO BE THE SECOND VOLTAGE DIFFERENCE Vt2.
S54
OUTPUT VOLTAGE VOP = L LEVEL?
YES
NO
S55
ADD X3 TO THE VALUE OF THE CONTROL SIGNAL CONT12, TO CHANGE THE COMMON VOLTAGE Vcm.
S56
SUBTRACT X4 FROM THE VALUE OF THE CONTROL SIGNAL CONT12, TO CHANGE THE COMMON VOLTAGE Vcm.
S57
n > 4?
YES
NO
END OF CORRECTION OPERATION (n=5)
S58
n = n + 1

FIG. 24

| NUMBER OF EXECUTION TIMES n (TIMES) | X3 (OUTPUT VOLTAGE VOP = L) | X4 (OUTPUT VOLTAGE VOP ≠ L) |
|---|---|---|
| 0 | 8 | 8 |
| 1 | 4 | 4 |
| 2 | 2 | 2 |
| 3 | 1 | 1 |
| 4 | 0 | 1 |

COMPARATOR AND CORRECTION METHOD THEREFOR

CROSS-REFERENCE TO RELATED APPLICATION

This application is based upon and claims the benefit of priority of the prior Japanese Patent Application No. 2012-262499, filed on Nov. 30, 2012, the entire contents of which are incorporated herein by reference.

FIELD

The present invention relates to a comparator and a correction method therefor.

BACKGROUND

A comparator circuit compares input voltages of two input signals to output an output signal according to the result of comparison. Normally, an input voltage difference (hereafter referred to as threshold voltage) that reverses a potential level in the output signal of the comparator circuit is zero volts. In a patent document 1, there is a description on the adjustment of the threshold voltage to a desired voltage by connecting, to an output terminal of the comparator circuit, a variable capacitor whose capacitance value is variable and controlling the capacitance value of the variable capacitor.

One application of the comparator circuit is a flash AD converter. The flash AD converter includes a plurality of comparator circuits disposed in parallel and an encoder to which each output signal of the plurality of comparator circuits is input. A mutually different threshold voltage is set to each of the plurality of comparator circuits, to which a reference signal and an analog input signal to be compared are input. Each comparator circuit compares the analog input signal voltage with the reference signal voltage, using each different threshold voltage. Based on the comparison result, an H-level or L-level output signal is output to the encoder. Then, based on each output signal of the comparator circuits, the encoder outputs a digital signal with a number of bits corresponding to the number of comparator circuits.

Related arts of comparator are the Japanese patent application No. 2011-206003 (the Japanese Laid-open Patent Publication No. 2013-070156), the official gazette of the Japanese Laid-open Patent Publication No. 2010-50590, and the official gazette of the Japanese Laid-open Patent Publication No. 2012-39548.

However, there may be a dispersed threshold voltage of the comparator according to a capacitance value of a variable capacitor connected to the output terminal of the comparator circuit, caused by manufacturing dispersion. For example, a variation amount of the threshold voltage according to the variation amount of the capacitance value of the variable capacitor may be dispersed. Also, by that the threshold voltage of the comparator circuit at a zero capacitance value of the variable capacitor is dispersed, so that an offset voltage may be produced in the threshold voltage. As such, dispersion in the threshold voltage according to a predetermined capacitance value of the variable capacitor causes difficulty when adjusting the threshold voltage to a desired value.

SUMMARY

One aspect of the present embodiment is a comparator comprising:

a comparator circuit configured to output to an output terminal an output voltage based on a voltage difference between a first input voltage which is input to a first input terminal and a second input voltage which is input to a second input terminal;

a variable capacitor connected to the output terminal;

an input voltage control circuit configured to generate a common voltage to be added to the first and the second input voltages, to generate the first and the second input voltages including a differential voltage generated according to the common voltage; and a correction circuit configured to control the variable capacitor to control the common voltage, wherein the correction circuit controls a first capacitance value of the variable capacitor so that the potential of the output voltage is reversed when the voltage difference equals a first voltage difference, and controls a second capacitance value of the variable capacitor so that the potential of the output voltage is reversed when the voltage difference equals a second voltage value which is different from the first voltage difference by a predetermined voltage value, and controls the common voltage so that a difference between the first capacitance value and the second capacitance value becomes equal to a predetermined capacitance value.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 16 is a flowchart illustrating a concrete example of the correction operation of the comparator according to the first embodiment.

FIG. 17 is a diagram illustrating a common voltage generated by the common voltage generator circuit to a control signal CONT12.

FIG. 18 is a flowchart illustrating detection operation (S22, S23 in FIG. 16) of the number of connections of variable capacitors relative to a predetermined threshold voltage according to the first embodiment.

FIG. 19 is a diagram illustrating increase and decrease values of the number of connections of variable capacitors for each number of execution times according to the first embodiment.

FIG. 20 is a diagram illustrating an example of each increase/decrease value of the common voltage set value for each number of execution times, according to the first embodiment.

FIG. 23 is a flowchart illustrating a typical example of the correction operation of the comparator according to the second embodiment.

FIG. 24 is a diagram illustrating an example of each increase/decrease value of the common voltage set value according to the second embodiment.

DESCRIPTION OF EMBODIMENTS

Hereafter, the embodiments of the present invention will be described by reference to the drawings.

Figure 1:
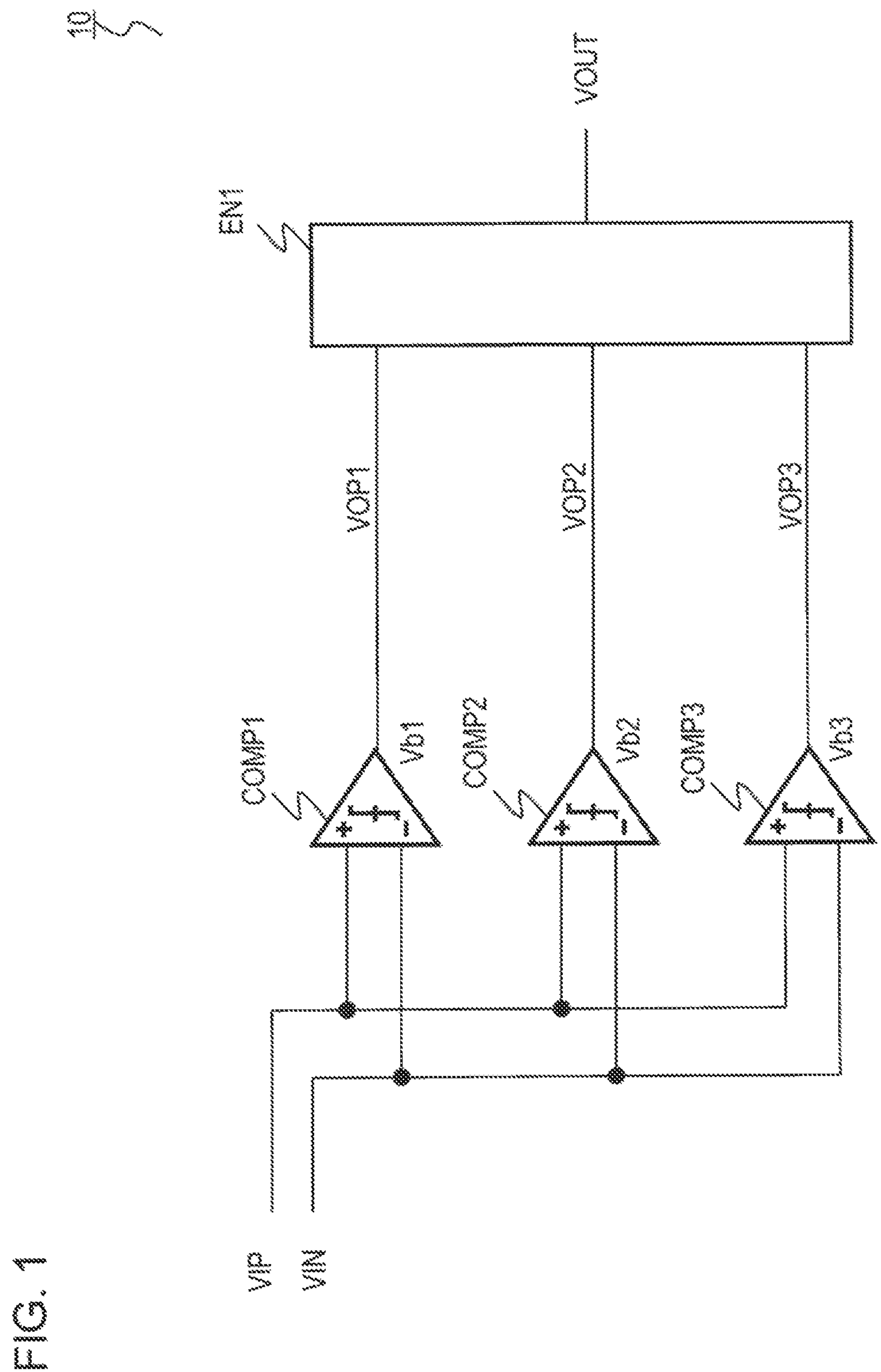
FIG. 1 is a diagram illustrating a flash AD converter.

FIG. 1 is a diagram illustrating a flash AD converter. A flash AD converter 10 depicted in FIG. 1 includes comparator circuits COMP1-COMP3 and an encoder EN1, and converts into a two-bit digital signal VOUT on the basis of an analog signal VIP and a reference signal or another analog signal VIN.

To each comparator circuit COMP1-COMP3, mutually different threshold voltages Vb1-Vb3 are set. The threshold voltages Vb1, Vb2, Vb3 are selected in order from the highest voltage to the lowest. Each comparator circuit COMP1-COMP3 compares voltages between the reference signal and the analog signal, and based on the comparison result, outputs an H-level or L-level output signal OP1-3 to the encoder EN1.

For example, if a voltage difference $\Delta V = VIP - VIN$ between the analog signal VIP and the reference signal VIN, or a voltage difference $\Delta V = VIP - VIN$ between analog differential voltages VIP, VIN, is higher than the threshold voltage Vb1 of the comparator COMP1 ($\Delta V > Vb1$), each potential level of the output voltages VOP1-VOP3 becomes L level.

The encoder EN1 outputs a two-bit digital signal VOUT according to the potential levels of the output voltages VOP1-VOP3 of the comparators COMP1-COMP3.

Figure 2:
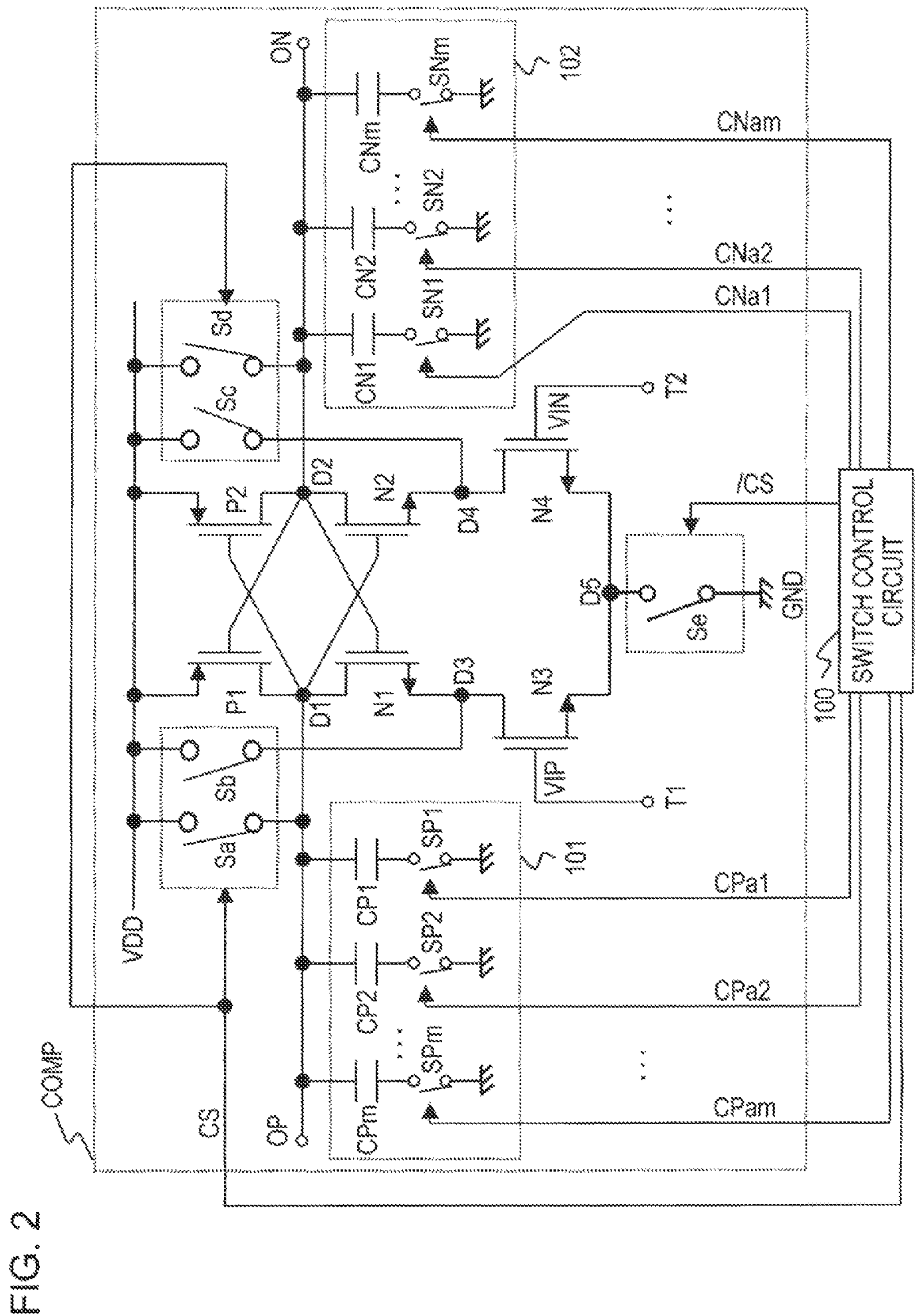
FIG. 2 is a diagram illustrating a comparator circuit.

FIG. 2 is a diagram illustrating a comparator circuit. The above-mentioned each comparator COMP1-COMP3 includes a similar configuration to the comparator circuit depicted in FIG. 2.

A comparator COMP includes PMOS transistors P1, P2, NMOS transistors N1-N4, switches Sa-Se and variable capacitance circuits 101, 102 each including a plurality of variable capacitors and switches.

The PMOS transistor P1 and the NMOS transistors N1, N3 are connected in series between a power voltage VDD and a reference power supply GND. A connection node D1 between the PMOS transistor P1 and the NMOS transistor N1 is connected to an output terminal OP. The connection node D1 is also connected to the power voltage VDD via the switch Sa. A connection node D3 between the NMOS transistors N1 and N3 is connected to the power voltage VDD via the switch Sb.

The PMOS transistor P2 and the NMOS transistors N2, N4 are connected in series between the power voltage VDD and the reference power supply GND. A connection node D2 between the PMOS transistor P2 and the NMOS transistor N2 is connected to an output terminal ON. The connection node D2 is also connected to the power voltage VDD via the switch Sd. A connection node D4 between the NMOS transistors N2 and N4 is connected to the power voltage VDD via the switch Sc.

The PMOS transistors P1, P2 and the NMOS transistors N1, N2 constitute a latch circuit. Namely, the connection node D1 is connected to the gates of the PMOS transistor P2 and the NMOS transistor N2, and the connection node D2 is connected to the gates of the PMOS transistor P1 and the NMOS transistor N1.

The NMOS transistors N1, N2 constitute a differential pair. A connection node N5 between the NMOS transistors N3 and N4 is connected to the reference power supply GND via the switch Se. The gate of the NMOS transistor N3 is connected to a non-inverted input terminal T1, to which the input voltage VIP is supplied. The gate of the NMOS transistor N4 is connected to an inverted input terminal T2, to which the input voltage VIN is supplied.

The switches Sa-Sd are controlled to be ON or OFF by a control signal CS from a switch control circuit 100, and the switch Se is controlled to be ON or OFF by an inverted control signal /CS obtained by inverting a control signal CS.

When the control signal CS is at H level, the switches Sa-Sd are switched ON, so that the connection nodes D1-D4 are raised to the power voltage VDD, and the switch Se is switched OFF to become a reset state.

When the control signal CS is at L level, the switches Sa-Sd are switched OFF and the switch Se is switched ON, so that the NMOS transistors N3, N4 become a conduction state depending on the gate voltages VIP, VIN. The latch circuit constituted by the PMOS transistors P1, P2 and the NMOS transistors N1, N2 amplifies a voltage difference produced between the connection nodes D1, D2, to output an H-level or L-level output voltage VOP from the output terminal OP.

The variable capacitance circuit 101 includes m variable capacitors CP1-CPm each connected to the output terminal OP, and switches SP1-SPm each disposed between each variable capacitor and the reference power supply GND. The variable capacitance circuit 102 includes m variable capacitors CN1-CNm each connected to the output terminal ON, and switches SN1-SNm each disposed between each variable capacitor and the reference power supply GND. The switches SP1-SPm and the switches SN1-SNm are controlled to be ON or OFF by control signals CPa1-CPam and CNa1-CNam supplied from the switch control circuit 100, respectively. With this, each capacitance value of the variable capacitance circuits 101, 102 connected to each output terminal OP, ON is controlled, so that the threshold voltage Vb of the comparator circuit is determined.

Now, the operation of the comparator circuit COMP will be described hereafter by reference to FIGS. 2-4.

Figure 3:
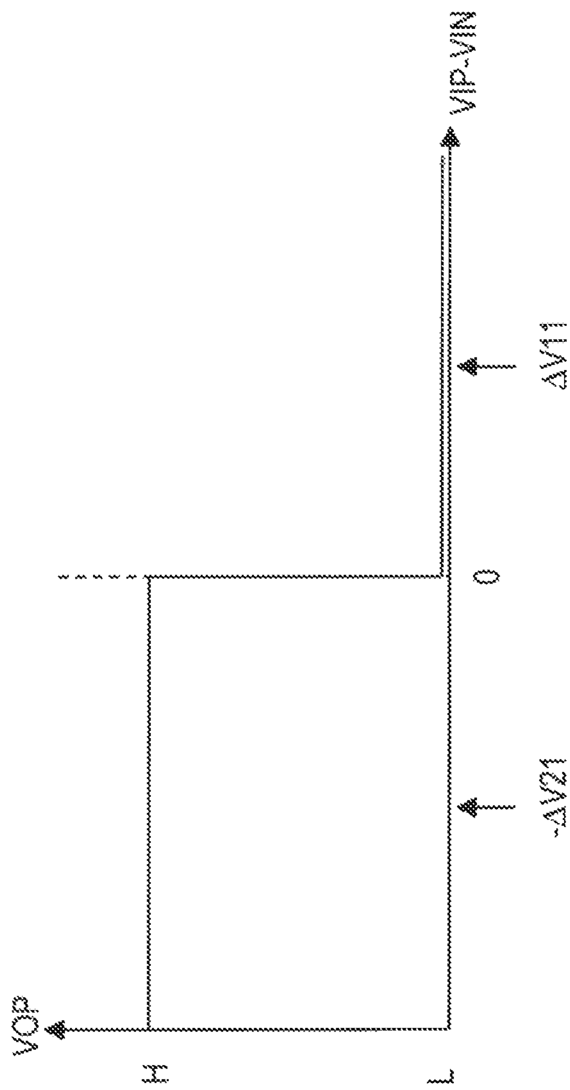
FIG. 3 is a diagram illustrating a first example of an output signal of the comparator circuit.

FIG. 3 is a diagram illustrating a first example of an output signal of the comparator circuit. FIG. 3 illustrates an example of the potential level of the output voltage VOP when all switches SP1-SPm, SN1-SNm are OFF, namely, when the threshold voltage Vb is 0 V.

When an input voltage VIP is higher by ΔV11 than an input voltage VIN (VIP−VIN=ΔV11), a current that flows through the NMOS transistors N1, N3 is larger than a current that flows through the NMOS transistors N2, N4. As a result, a voltage at the connection node D1 becomes lower than a voltage at the connection node D2, and further, a voltage difference between the connection nodes D1, D2 is amplified by the latch circuit. By this, the output terminal OP becomes L level, and the output terminal ON becomes H level. Thus, from the comparator circuit COMP, an L-level output voltage VOP is output, as depicted in FIG. 3.

On the other hand, when an input voltage VIP is lower by ΔV21 than an input voltage VIN (VIP−VIN=−ΔV21), a current that flows through the NMOS transistors N2, N4 is larger than a current that flows through the NMOS transistors N1, N3. As a result, a voltage at the connection node D2 becomes lower than a voltage at the connection node D1, and further, a voltage difference between the connection nodes D1, D2 is amplified by the latch circuit. By this, the output terminal OP becomes H level, and the output terminal ON becomes L level. Thus, an H-level output voltage VOP is output from the comparator circuit COMP, as depicted in FIG. 3.

As such, in FIG. 3, the potential level of the output voltage VOP is reversed at VIP−VIN=0V that functions as a threshold voltage Vb.

Figure 4:
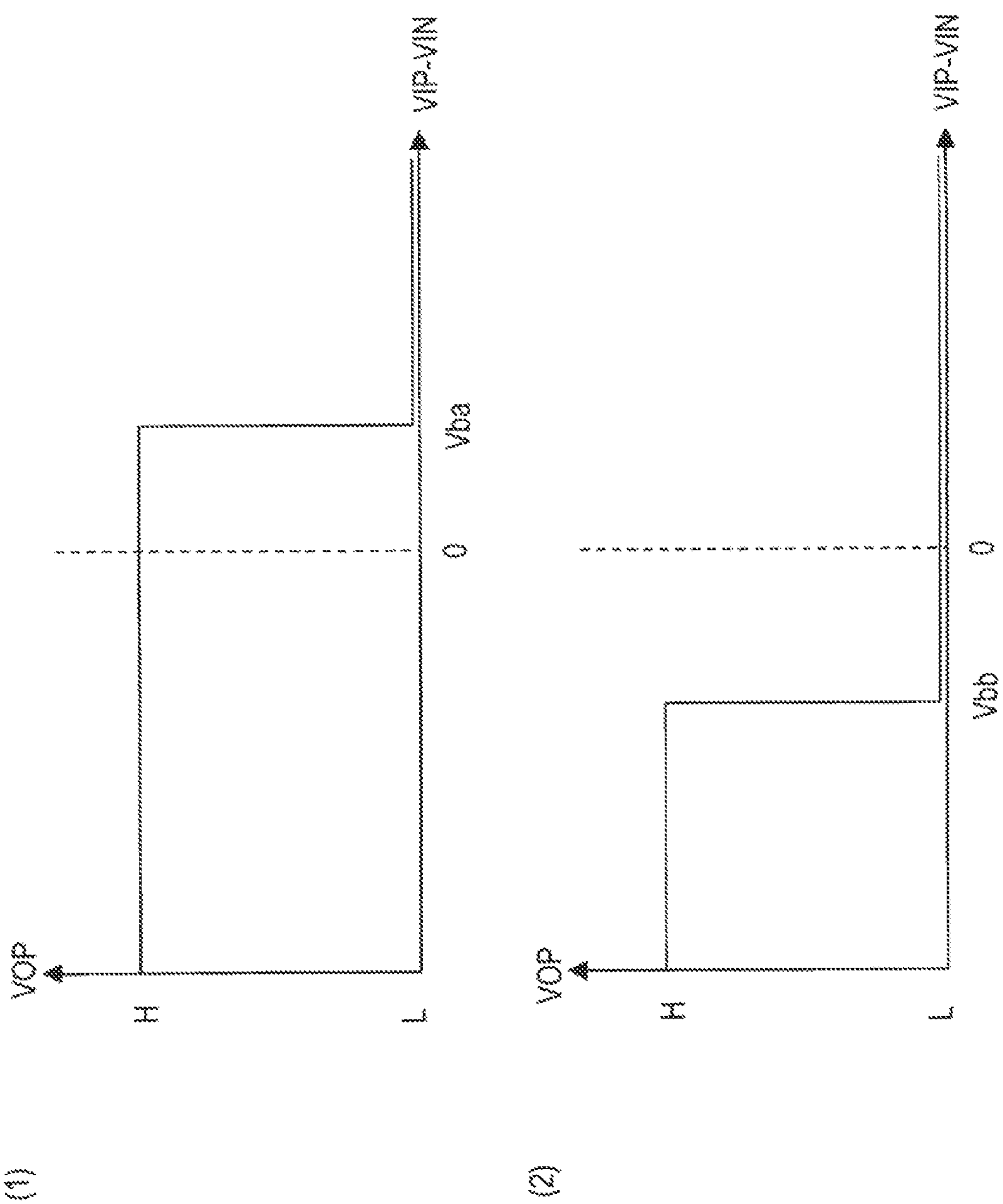
FIG. 4 is a diagram illustrating a second example of the output signal of the comparator circuit.

FIG. 4 is a diagram illustrating a second example of the output signal of the comparator circuit.

In FIG. 4, (1) illustrates an exemplary potential level of the output voltage VOP when an arbitrary number of switches SP1-SPm are switched ON and all switches SN1-SNm are switched OFF, in other words, when the capacitance value of variable capacitors connected to the output terminal VOP is larger than the capacitance value of variable capacitors connected to the output terminal VON.

In (1) in FIG. 4, because the capacitance value of variable capacitors 101 connected to the output terminal VOP is larger than the capacitance value of variable capacitors 102 connected to the output terminal VON, when the control signal CS is switched to L level, a voltage at the connection node D1 is hard to decrease or decreases slower than the node D2. Therefore, the threshold voltage Vb at which the output voltage VOP is switched from H level to L level comes to be a higher threshold voltage Vba, as compared to the case depicted in FIG. 3.

In FIG. 4, (2) illustrates an exemplary potential level of the output voltage VOP when all switches SP1-SPm are switched OFF and an arbitrary number of switches SN1-SNm are switched ON, in other words, when the capacitance value of variable capacitors 102 connected to the output terminal VON is larger than the capacitance value of variable capacitors 101 connected to the output terminal VOP.

In (2) in FIG. 4, because the capacitance value of variable capacitors 102 connected to the output terminal VON is larger than the capacitance value of variable capacitors 101 connected to the output terminal VOP, when the control signal CS is switched to L level, the voltage at the connection node D2 is hard to decrease or decreases slower than the node D1. Therefore, the threshold voltage Vb at which the output voltage VOP is switched from H level to L level comes to be a lower threshold voltage Vbb, as compared to the case depicted in FIG. 3.

As such, by the change of the capacitance value of variable capacitors 101, 102 connected to each output terminal VOP, VON, the threshold voltage of the comparator circuit COMP is changed.

Next, by reference to FIGS. 5 to 7, a description will be given on the variation of the threshold voltage relative to the variation of the capacitance values of variable capacitors connected to each output terminal.

Figure 5:
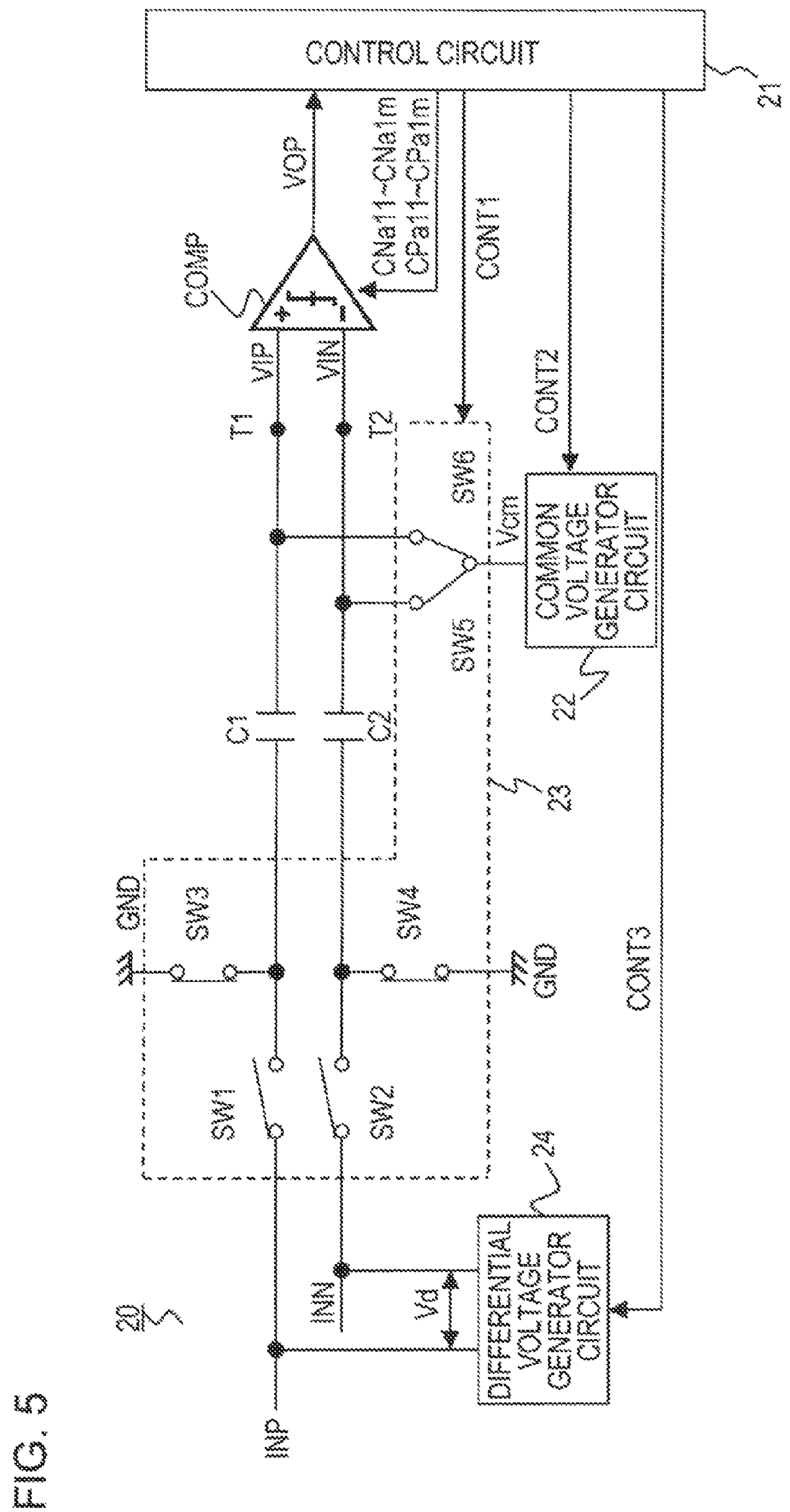
FIG. 5 is an example of a comparator that detects the threshold voltage of the comparator circuit and performs correction to a desired threshold voltage.

FIG. 5 is an example of a comparator that detects the threshold voltage of the comparator circuit and performs correction to a desired threshold voltage.

A comparator 20 includes a positive input terminal INP and a negative input terminal INN, a comparator circuit COMP; input capacitors C1, C2 respectively connected to the input terminals T1, T2 of the comparator circuit COMP; a common voltage generator circuit 22 that generates a common voltage Vcm to change an input voltage VIP of the input terminal T1 and an input voltage VIN of the input terminal T2 to be in a voltage range in which the comparator circuit operates normally; a switch group 23 including switches SW1-SW6; a differential voltage generator circuit 24 that generates a differential voltage Vd being added to the common voltage Vcm; and a control circuit 21 that controls to switch the switches SP1-SPm, SN1-SNm ON and OFF, similar to the switching control circuit 100 depicted in FIG. 2.

Here, the control circuit 21 outputs a control signal CONT1 to the switch group 23, to control to switch the switches SW1-SW6 ON and OFF. Also, the control circuit 21 outputs a control signal CONT2 to the common voltage generator circuit 22 on the basis of the output voltage VOP of the comparator circuit COMP, to control the common voltage Vcm. Further, the control circuit 21 outputs a control signal CONT3 to the differential voltage generator circuit 24 on the basis of the output voltage VOP of the comparator circuit COMP, to control the differential voltage Vd.

The differential voltage generator circuit 24 supplies the differential voltage Vd to the positive input terminal INP and the negative input terminal INN. The positive input terminal INP and the negative input terminal INN is connected to the one terminal of the input capacitors C1, C2 via the switches SW1, SW2, and the other terminals of the input capacitors C1, C2 are connected to the input terminals T1, T2. The input capacitors C1, C2 are connected to the reference power supply GND via the switches SW3, SW4. The common voltage generator circuit 22 is connected to the input terminals T1, T2 of the comparator circuit COMP via the switches SW5, SW6.

The comparator 20 performs the following operation to detect the threshold voltage of the comparator circuit.

First, the control circuit 21 connects an arbitrary number of variable capacitors to the output terminal of the comparator circuit COMP. Here, the switches SP1-SPm, SN1-SNm are controlled to be in either one of the following states: all switches SP1-SPm, SN1-SNm are switched OFF (state 1); an arbitrary number of switches among the switches SP1-SPm are switched ON, whereas all switches SN1-SNm are switched OFF (state 2); and an arbitrary number of switches among the switches SN1-SNm are switched ON, whereas all switches SP1-SPm are switched OFF (state 3).

Next, the comparator circuit COMP is supplied with the input voltages VIP and VIN having a differential voltage Vd around the potential corresponding to a predetermined common voltage Vcm. More specifically, the control circuit 21 switches OFF the switches SW1, SW2, switches ON the switches SW3-SW6, and controls and maintains the common voltage Vcm of the common voltage generator circuit 22 at a predetermined voltage. As a result, the input capacitors C1, C2 are charged to the common voltage Vcm. Then, after switching OFF the switches SW3-SW6, the control circuit 21 switches ON the switches SW1, SW2, controls the differential voltage Vd of the differential voltage generator circuit 24 to be a predetermined voltage, so as to output V0+Vd/2 to the input terminal T1 via C1 and V0−Vd/2 to the input terminal T2 via C2. As a result, the output V0+Vd/2, V0−Vd/2 are added to the common voltage Vcm, so that an input voltage VIP=Vcm+V0+Vd/2 and an input voltage VIN=Vcm+V0−Vd/2 are respectively supplied to the comparator circuit COMP. Vcm+V0 is the potential corresponding to the common voltage Vcm.

Finally, the control circuit 21 changes the differential voltage Vd on the basis of the potential level of the output voltage VOP of the comparator circuit COMP, to detect a differential voltage Vd (CONT3 for Vd) at which the potential level of the output voltage VOP switches between H/L levels, namely, to detect a threshold voltage Vb of the comparator circuit COMP.

The comparator 20 performs such operation while changing the number of variable capacitors connected to the output terminal, and by detecting each threshold voltage Vb, the comparator 20 obtains each threshold voltage Vb relative to each capacitance value of variable capacitors connected to the output terminal. By setting the capacitance value of the variable capacitors based on the above result, correction to a desired threshold voltage Vb is performed.

Figure 6:
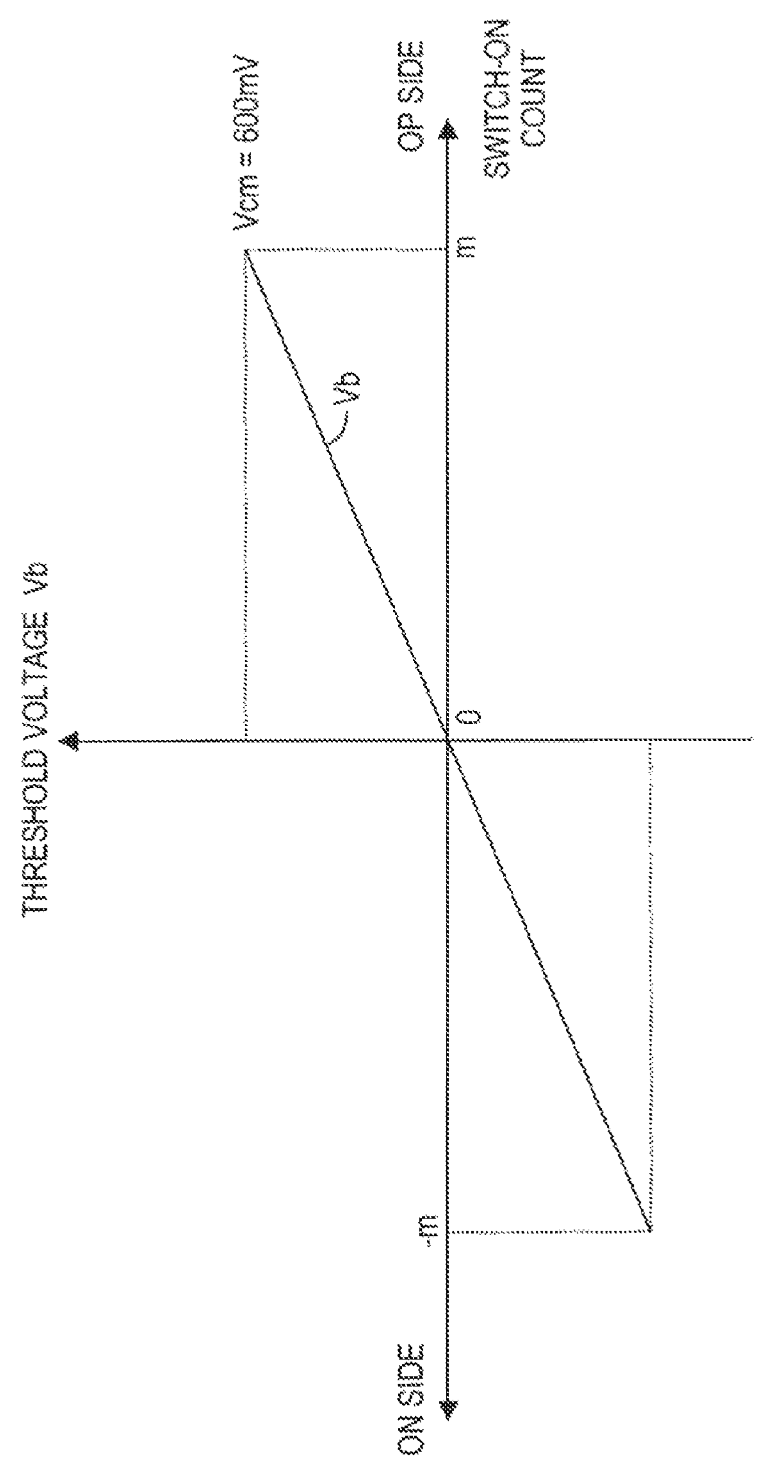
FIG. 6 is a diagram illustrating a first example of threshold voltages relative to the capacitance values of the variable capacitors connected to the output terminal of the comparator circuit.

FIG. 6 is a diagram illustrating a first example of threshold voltages relative to the capacitance values of the variable capacitors connected to the output terminal of the comparator circuit. FIG. 6 depicts the threshold voltage Vb detected by the comparator 20 depicted in FIG. 5, for each number of variable capacitors connected to the output terminal. In FIG. 6, the common voltage Vcm is 600 mV. The vertical axis in FIG. 6 represents the threshold voltages Vb, and the horizontal axis represents the number of variable capacitors connected to the output terminal. In FIG. 6, the number of switches SP1-SPm in an ON state is represented with a positive number, and the number of switches SN1-SNm in an ON state is represented with a negative number.

As depicted in FIG. 6, the threshold voltage Vb of the comparator circuit COMP is proportional to the capacitance value of the variable capacitors. Typically, when the number of variable capacitors connected to each output terminal OP, ON is zero, the threshold voltage Vb is 0 V. Further, if the number of variable capacitors connected to the output terminal OP is increased (positive direction in the horizontal axis) while the number of variable capacitors connected to the output terminal ON is maintained to be zero, the threshold voltage Vb becomes proportionally higher. On the other hand, if the number of variable capacitors connected to the output terminal ON is increased (negative direction in the horizontal axis) while the number of variable capacitors connected to the output terminal OP is maintained to be zero, the threshold voltage Vb becomes proportionally lower.

Figure 7:
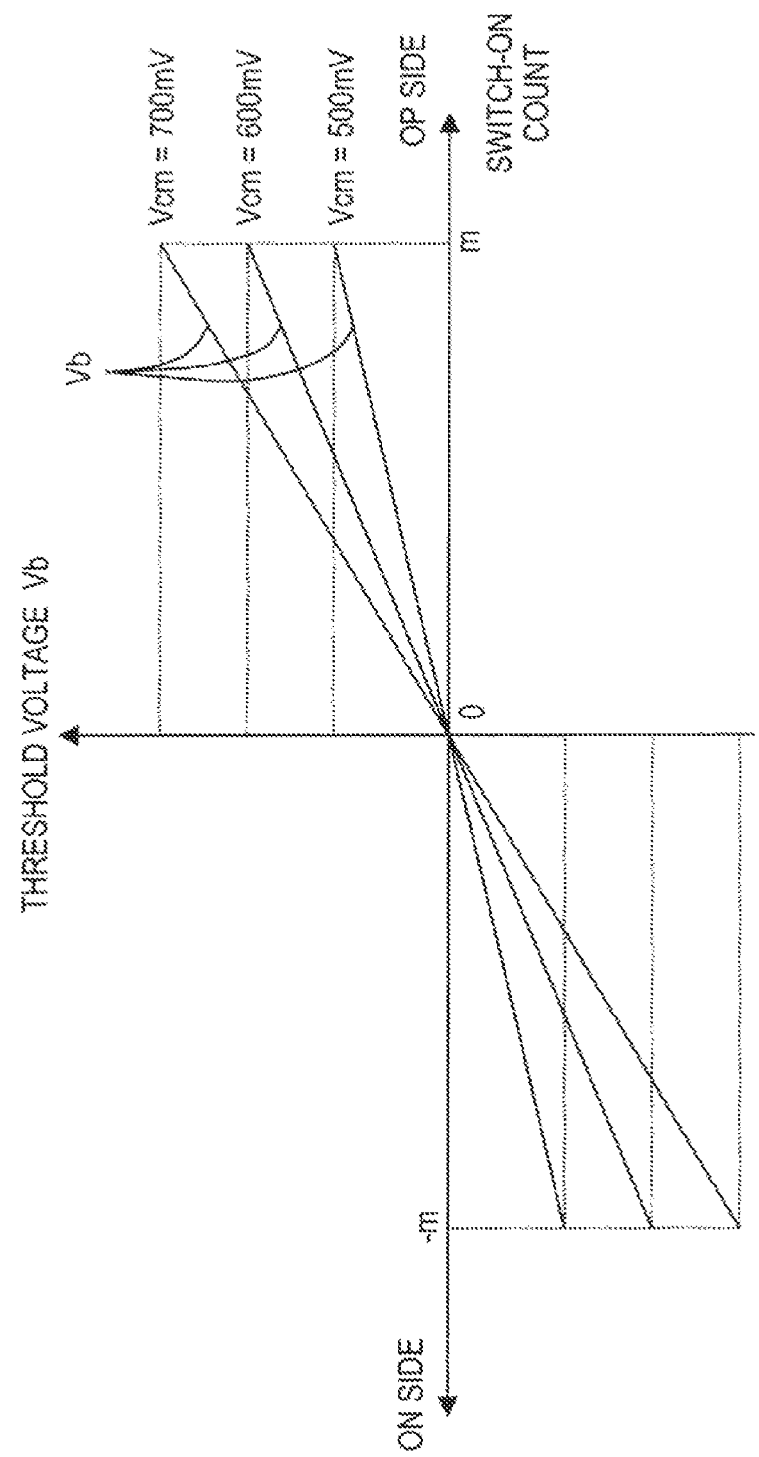
FIG. 7 is a diagram illustrating a second example of threshold voltages relative to the capacitance values of the variable capacitors connected to the output terminal.

FIG. 7 is a diagram illustrating a second example of threshold voltages relative to the capacitance values of the variable capacitors connected to the output terminal. In FIG. 7, threshold voltages Vb detected at each common voltages Vcm, 700 mV, 600 mV or 500 mV controlled by the comparator 20 depicted in FIG. 5 are depicted.

As depicted in FIG. 7, when the number of variable capacitors connected to each output terminal OP, ON is zero, the threshold voltage Vb is 0 V in any common voltage Vcm. In other words, when the number of variable capacitors connected to the output terminal is zero, the threshold voltage Vb comes to have a common predetermined value, irrespective of the common voltage Vcm.

However, as the common voltage Vcm is higher, a variation amount of the threshold voltage Vb relative to the variation of the number of variable capacitors connected to the output terminal is larger. In other words, a inclination of a variation line Vb that indicates proportional relation of the threshold voltage Vb to the capacitance value of the variable capacitors is larger.

As such, in the comparator circuit COMP, the threshold voltage Vb varies in proportion to the capacitance value of the variable capacitors, and as the common voltage Vcm is higher, so the variation amount of the threshold voltage Vb, that is, the inclination of the variation line becomes larger. The reason is that, as the common voltage is higher, a larger drain current difference is produced between the NMOS transistors N3, N4 of the comparator circuit COMP.

Figure 8:
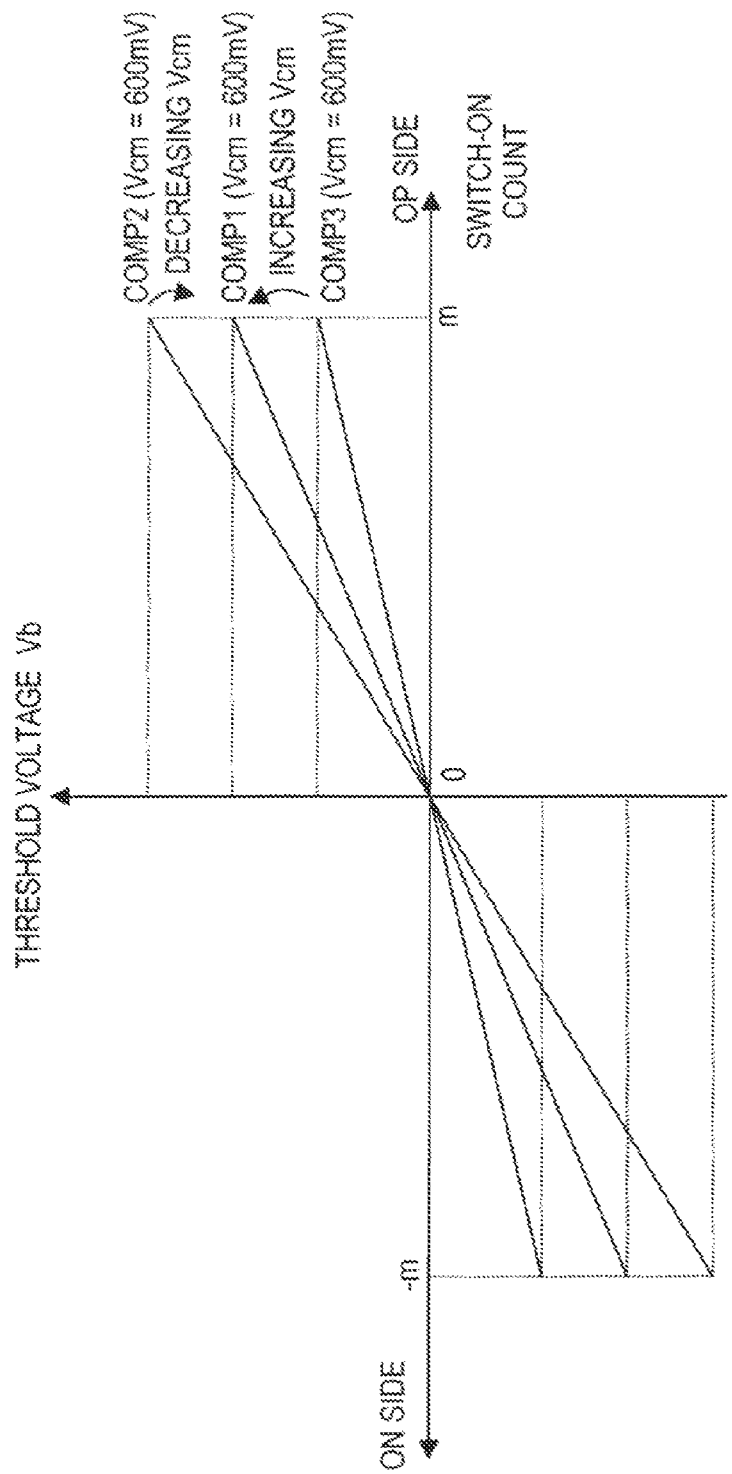
FIG. 8 is a diagram illustrating a first example of threshold voltages based on each comparator circuit.

FIG. 8 is a diagram illustrating a first example of threshold voltages based on each comparator circuit. FIG. 8 depicts the threshold voltages Vb detected for three types of comparator circuits COMP1-COMP3, when the comparator 20 depicted in FIG. 5 controls the common voltage Vcm to be 600 mV.

There may be a case that manufacturing dispersion is produced on the PMOS transistors P1, P2 and the NMOS transistors N1-N4 included in each comparator circuit COMP1-COMP3. As an example, in the comparator circuit COMP1, each transistor P1, P2, N1-N4 is a threshold Vth that satisfies a design value. On the other hand, in the comparator circuit COMP2, the magnitude of the threshold Vth of each transistor P1, P2, N1-N4 becomes smaller than the design value, and as a result, the comparator circuit COMP2 operates at higher speed. Also, in the comparator circuit COMP3, the magnitude of the threshold Vth of each transistor P1, P2, N1-N4 becomes larger than the design value, and as a result, the comparator circuit COMP3 operates at lower speed.

Due to such manufacturing dispersion, as depicted in FIG. 8, there is produced a difference in each variation amount of the threshold voltage Vb relative to the capacitance value of the variable capacitors connected to the output terminal, namely in each inclination of the variation line, among comparator circuits COMP1-COMP3.

More specifically, if the number of variable capacitors connected to each output terminal OP, ON is zero, each threshold voltage Vb of comparator circuits COMP1-COMP3 is 0 V.

However, as compared to the comparator circuit COMP1, the comparator circuit COMP2 has a larger variation amount of the threshold voltage Vb relative to the variation in the number of variable capacitors connected to the output terminal. In other words, as compared to the comparator circuit COMP1, the comparator circuit COMP2 has a larger inclination of the variation line that indicates proportional relation of the threshold voltage to the variable capacitors. The reason is that, in the comparator circuit COMP2, the threshold voltage Vth of the NMOS transistors N3, N4 is smaller, and therefore, as compared to the comparator circuit COMP1, a larger difference is produced in the drain currents of the NMOS transistors N3, N4 even under the same common voltage Vm. That is, in the comparator circuit COMP2 having lower threshold voltage Vth, the inclination of the variable line is larger, as the case where the common voltage Vm is controlled to be larger and the difference of the drain currents of NMOS transistors N3, N4 becomes larger as depicted in FIG. 7.

Also, as compared to the comparator circuit COMP1, the comparator circuit COMP3 has a smaller variation amount of the threshold voltage Vb relative to the variation in the number of variable capacitors connected to the output terminal. In other words, as compared to the comparator circuit COMP1, the comparator circuit COMP3 has a smaller inclination of the variation line that indicates proportional relation of the threshold voltage to the variable capacitors. The reason is that, in the comparator circuit COMP3, the threshold Vth of the NMOS transistors N3, N4 is larger, and therefore, as compared to the comparator circuit COMP1, a smaller difference is produced in the drain currents of the NMOS transistors N3, N4 even under the same common voltage Vm.

In such a case of the production dispersion, it is necessary to correct the comparator circuits COMP1-COMP3. Here, as depicted in FIG. 7, as the common voltage Vcm is larger, so the variation amount of the threshold Vb, that is, the inclination of the variation line becomes larger. Then, as an example, the comparator 20 performs a correction operation as a bases of the comparator circuit COMP1, in a manner as described below.

First, for the comparator circuit COMP2, the comparator 20 maintains an arbitrary number (m, for example) of variable capacitors connected to the output terminal and controls a common voltage Vcm at a voltage lower than 600 mV as depicted in FIG. 8. Then, as described by reference to FIG. 5, the comparator 20 performs operation of detecting the threshold voltage Vb of the comparator circuit COMP2, to compare with the threshold voltage Vb of the comparator circuit COMP1 of which the variable capacitors connected to the output terminal is also m. According to the comparison result, the comparator 20 changes the common voltage Vcm, and each time the common voltage Vcm is varied, detects the threshold voltage Vb and performs comparison. Thus, it is possible to detect a corrected common voltage Vcmc1 (for example, 550 mV) by which the threshold voltage Vb of the comparator circuit COMP2 becomes equal to the threshold voltage Vb of the comparator circuit COMP1.

With this, the variation amount of the threshold voltage Vb of the comparator circuit COMP2 when the common voltage Vcm is the corrected common voltage Vcmc1 (550 mV) becomes equal to the variation amount of the threshold voltage Vb of the comparator circuit COMP1 when the common voltage Vcm is 600 mV. Namely, by the above-mentioned correction operation, the inclination of the variation line of the comparator circuit COMP2 becomes gentler. As a result, the variation line of the comparator circuit COMP1 becomes coincident with the variation line of the comparator circuit COMP2.

Also, for the comparator circuit COMP3, the comparator 20 maintains an arbitrary number (m, for example) of variable capacitors connected to the output terminal, and controls a common voltage Vcm at a voltage higher than 600 mV as depicted in FIG. 8, similar to the above-mentioned case, and thus, it is possible to detect a corrected common voltage Vcmc2 (for example, 680 mV) by which the threshold voltage Vb of the comparator circuit COMP2 becomes equal to the threshold voltage Vb of the comparator circuit COMP1.

With this, the variation amount of the threshold voltage Vb of the comparator circuit COMP3 with the common voltage Vcm being the corrected common voltage Vcmc2 becomes equal to the variation amount of the threshold voltage Vb of the comparator circuit COMP1 with the common voltage Vcm being 600 mV. Namely, by the above-mentioned correction operation, the inclination of the variation line of the comparator circuit COMP3 becomes steeper. As a result, the variation line of the comparator circuit COMP1 becomes coincident with the variation line of the comparator circuit COMP3.

As such, when each variation amount of the threshold voltage Vb is different depending on each comparator circuit due to manufacturing dispersion, the comparator 20 maintains the number of variable capacitors connected to the output terminal to be an arbitrary number, and corrects the common voltage Vcm in a manner to produce a desired threshold voltage.

Then, for example, in the flash AD converter 10 as depicted in FIG. 1, the comparator circuits COMP1-COMP3 use the common voltage Vcm (=600 mV) and the corrected common voltages Vcm1, Vcm2, respectively, so as to be corrected to have the same characteristics in regard to the threshold voltage Vb relative to the capacitance value of variable capacitors connected to the output terminal. Further, by controlling the number of connections of the variable capacitors, the comparator circuits COMP1-COMP3 are similarly set to respective desired threshold voltages.

Figure 9:
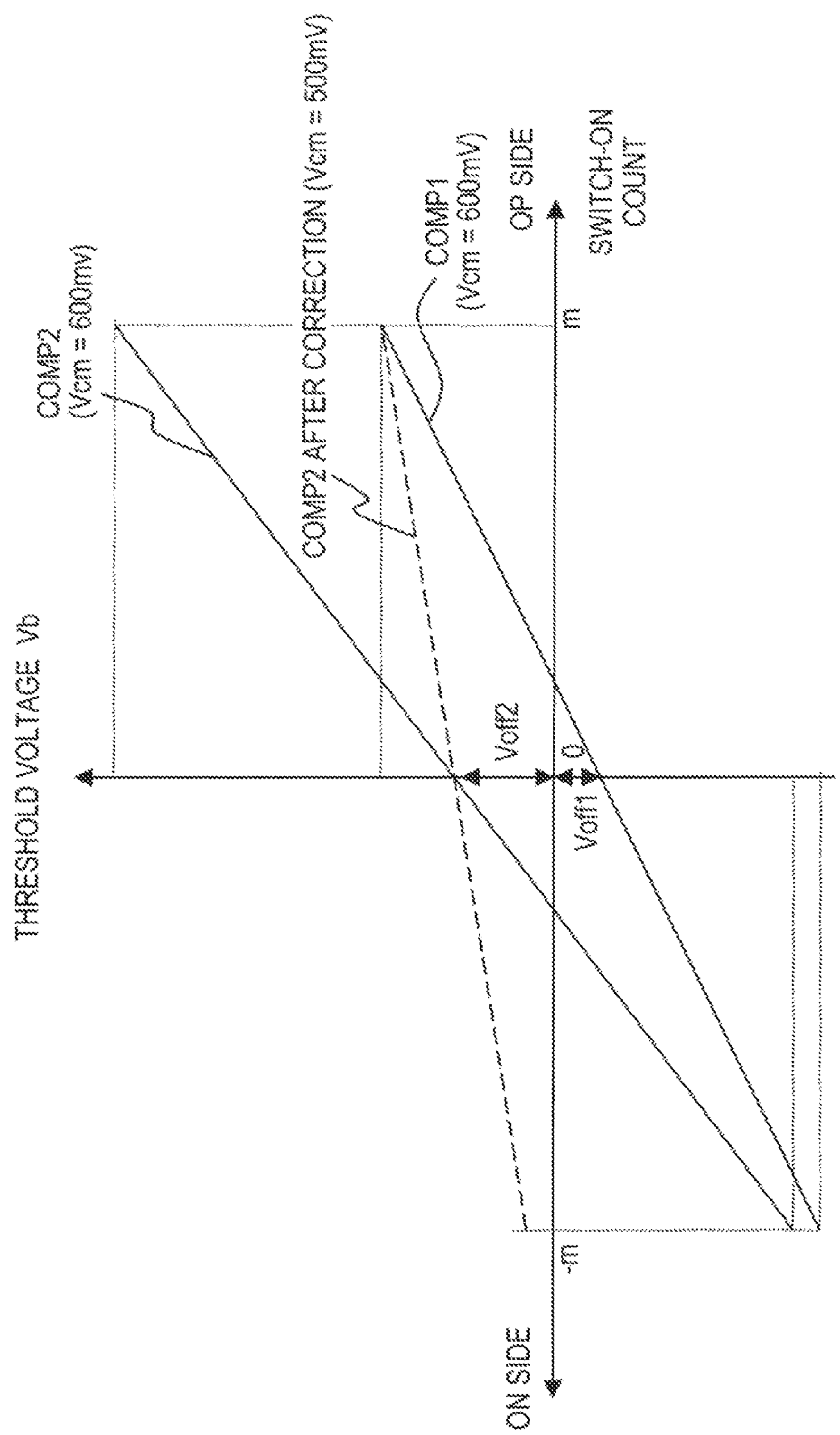
FIG. 9 is a diagram illustrating a second example of threshold voltages based on each comparator circuit.

FIG. 9 is a diagram illustrating a second example of threshold voltages based on each comparator circuit. FIG. 9 depicts cases when offset voltages Voff are produced on the threshold voltages Vb when the number of variable capacitors connected to each output terminal OP, ON is zero. In FIG. 9, due to manufacturing dispersion, there is produced a different variation amount of the threshold voltage Vb relative to the capacitance value of the variable capacitors connected to the output terminal, namely, a different inclination of the variation line. Further, in each comparator circuit COMP1, COMP2, each offset voltage Voff1, Voff2 is produced.

In such a case, if the comparator 20 performs correction of the comparator COMP2, using the comparator circuit COMP1 as a basis, in a similar manner to FIG. 8, a variation line after the correction becomes a broken line depicted in FIG. 9. As a result, although the threshold voltage Vb of the comparator circuit COMP2 is the same as the comparator circuit COMP1 when the connection number being m, the inclination of the variation line after the correction of the comparator circuit COMP2 is not coincident with the inclination of the variation line of the comparator circuit COMP1. Therefore, when the offset voltage Voff1, Voff2 is produced, it is not possible to correct the comparator circuit 2 by the comparator 20, if corrected according to the manner in FIG. 8.

Figure 11:
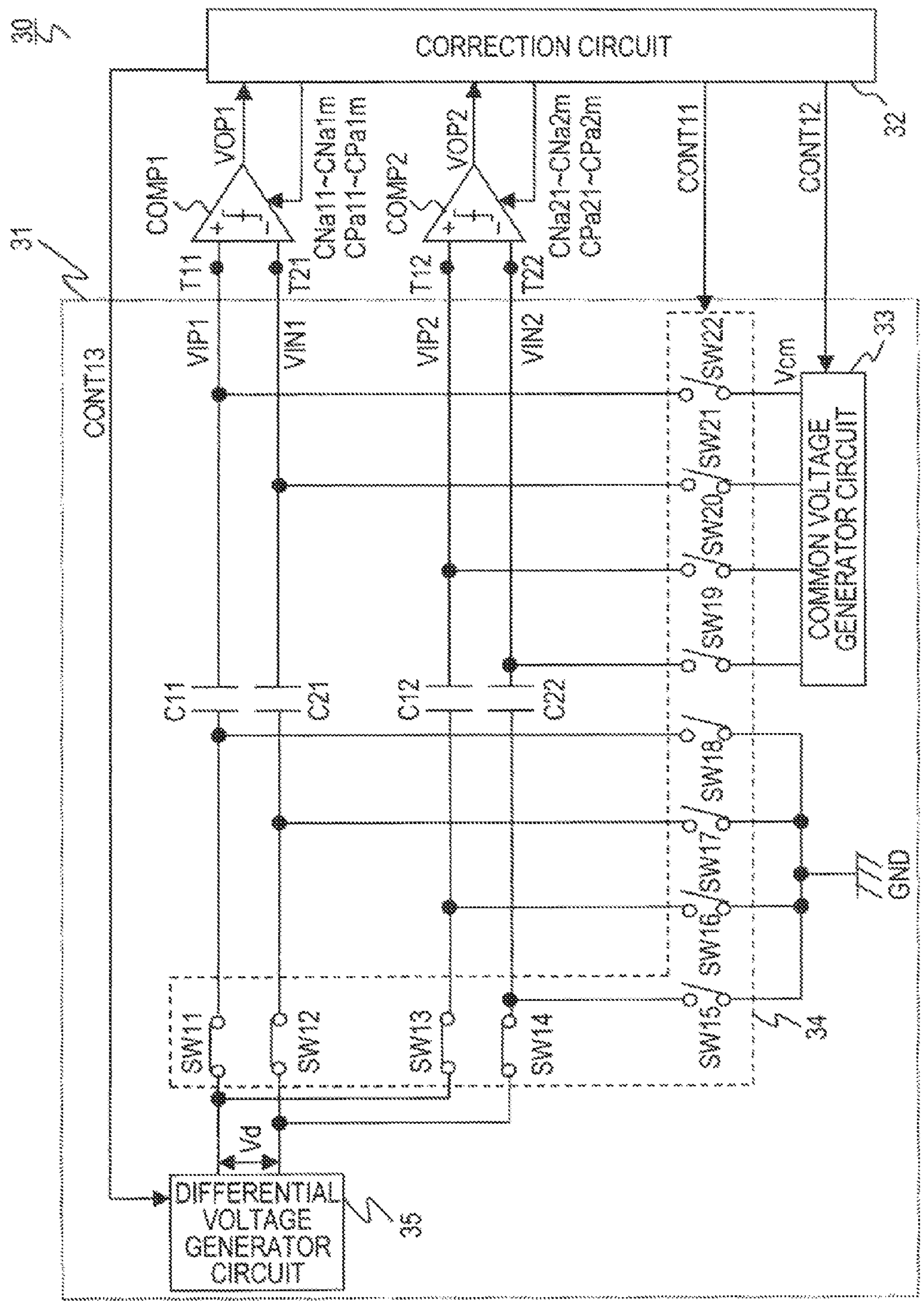
FIG. 11 is a diagram illustrating a comparator according to the first embodiment.
Figure 12:
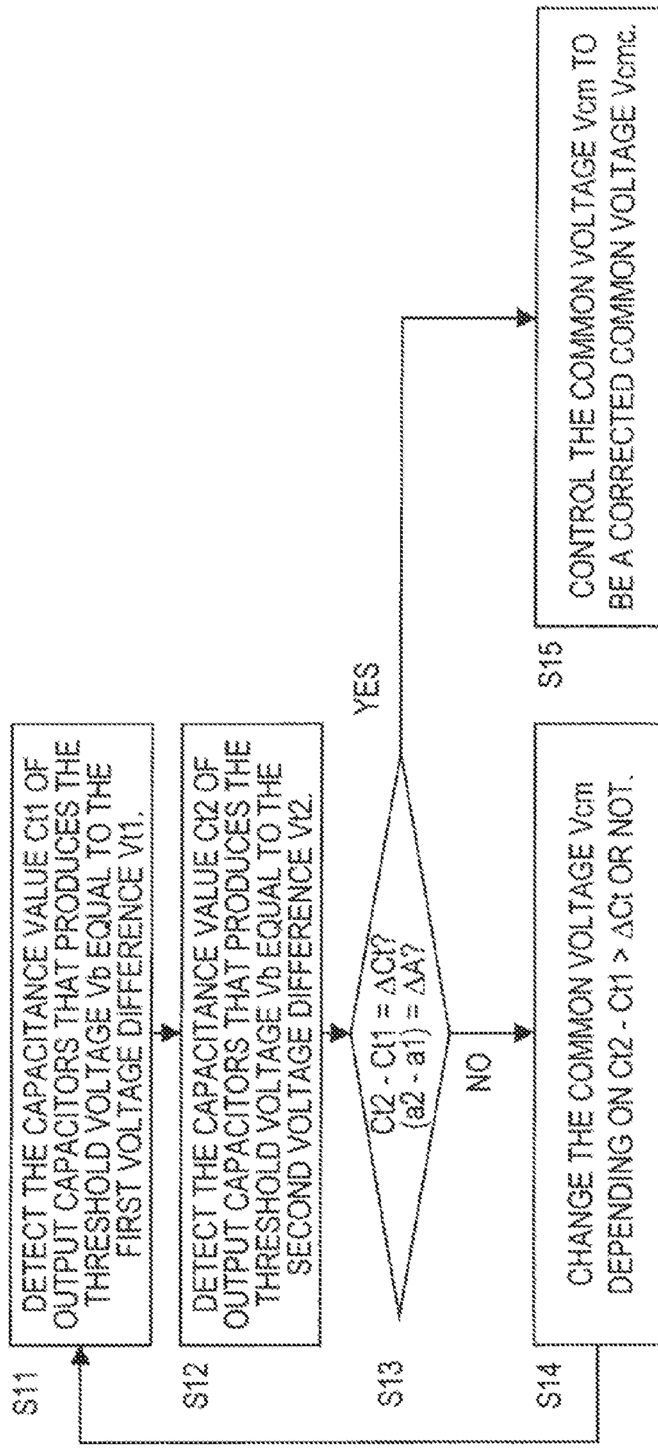
FIG. 12 is a flowchart of the correction operation according to the first embodiment.
Figure 21:
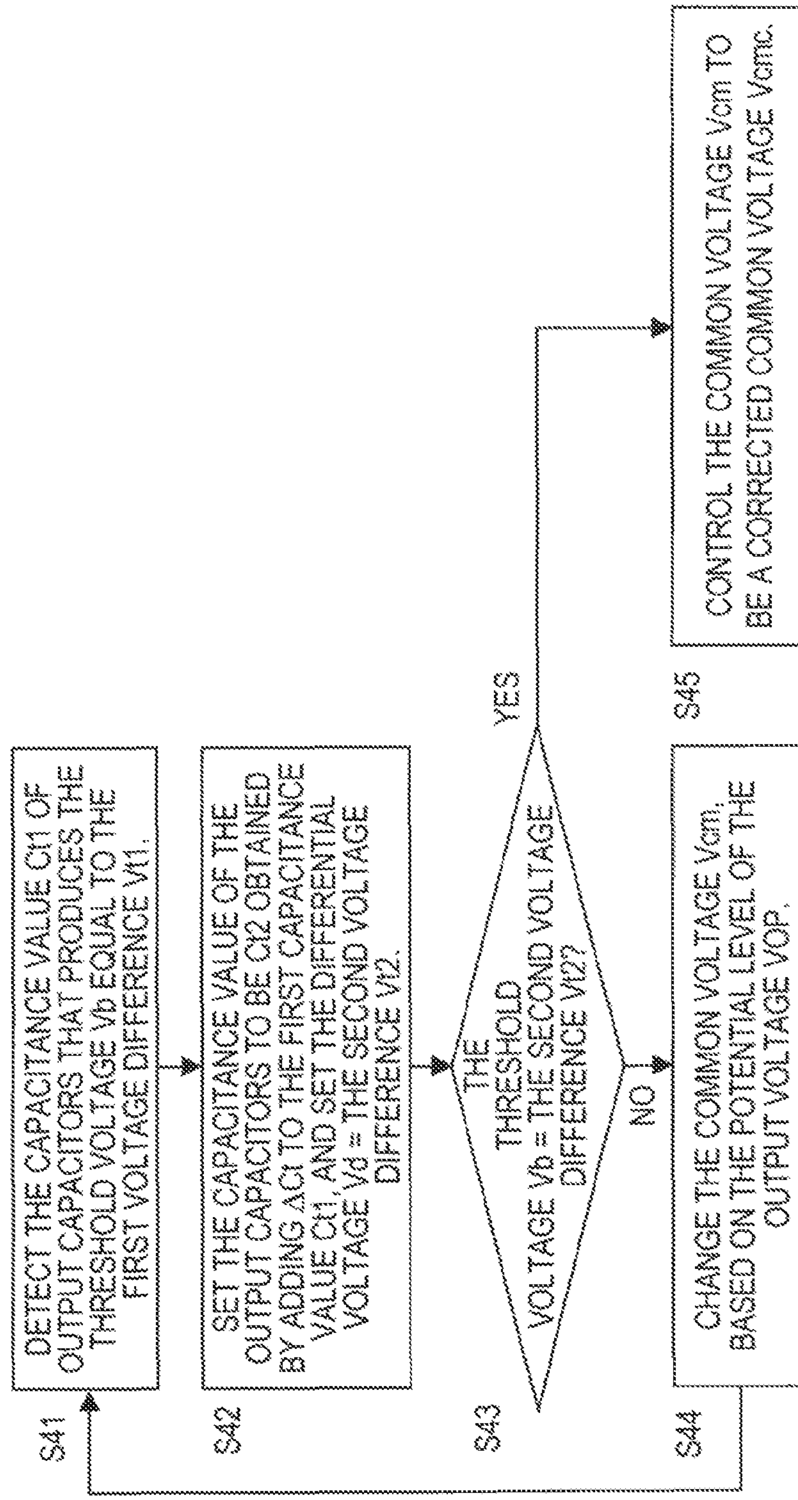
FIG. 21 is a diagram illustrating a flowchart of correction operation according to the second embodiment.

According to the present embodiment, the comparator 30 in FIG. 11 performs correction operation as depicted in FIG. 12 or 21, which will be described later, so that the correction of the comparator circuit COMP1, COMP2 is possible, even if the offset voltage Voff1, Voff2 is produced.

First Embodiment

Figure 10:
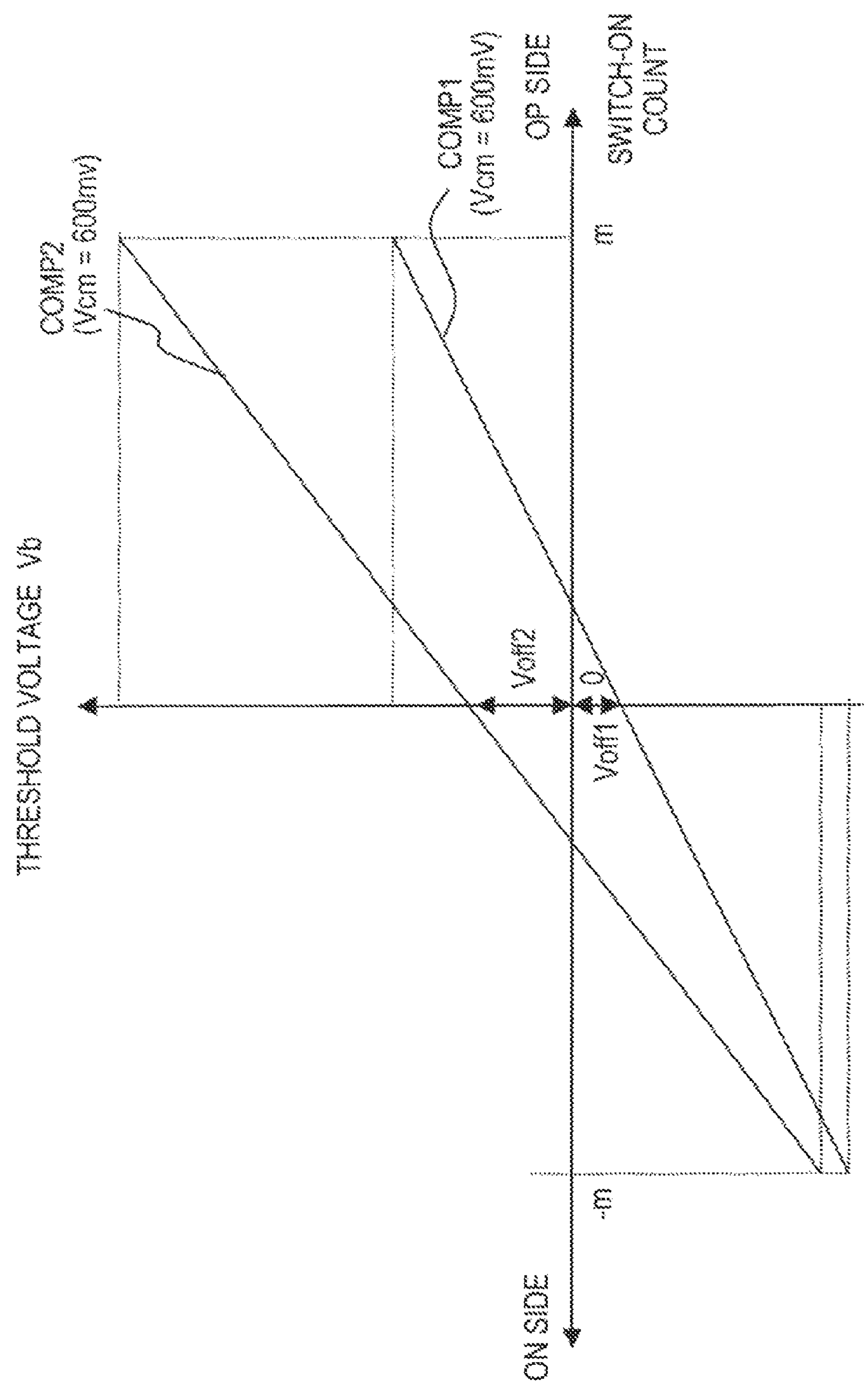
FIG. 10 illustrates an example of the threshold voltage of each comparator circuit according to a first embodiment.

FIG. 10 illustrates an example of the threshold voltage of each comparator circuit according to a first embodiment. In the first embodiment, it is assumed that in each comparator circuit COMP1, COMP2 with the common voltage Vcm being 600 mV, the threshold voltage Vb is varied when changing the connection number of the variable capacitors as depicted in FIG. 10. Namely, the inclination of the variation line of the comparator circuit COMP1 is gentler than that of the comparator circuit COMP2, and each offset voltage Voff1, Voff2 is produced in each comparator circuit COMP1, COMP2.

FIG. 11 is a diagram illustrating a comparator according to the first embodiment. A comparator 30 performs offset voltage correction operation to correct the comparator circuit COMP1, COMP2, as will be described later.

The comparator 30 includes: each comparator circuit COMP1, COMP2 whose configuration is identical to the comparator circuit COMP depicted in FIG. 2; an input voltage control circuit 31 that generates input voltages VIP1, VIN1 of the comparator circuit COMP1 and input voltages VIP2, VIN2 of the comparator circuit COMP2; and a correction circuit 32 that controls correction operation.

The input voltage control circuit 31 includes: input capacitors C11, C21 connected to input terminals T11, T21 of the comparator circuit COMP1; input capacitors C12, C22 connected to input terminals T12, 22 of the comparator circuit COMP2; a common voltage generator circuit 33 that generates a common voltage Vcm; a switch group 34 including SW11-SW22; and a differential voltage generator circuit 35 that generates a differential voltage Vd around the potential corresponding to the common voltage Vcm.

The correction circuit 32 outputs control signals CPa11-CPa1*m*, CNa11-CNa1*m* to the comparator circuit COMP1 on the basis of an output voltage VOP1 of the comparator circuit COMP1, to control the switches SP1-SPm, SN1-SNm of the comparator circuit COMP1 to be ON and OFF. Similarly, the correction circuit 32 outputs control signals CPa21-CPa2*m*, CNa21-CNa2*m* to the comparator circuit COMP2 on the basis of an output voltage VOP2 of the comparator circuit COMP2, to control the switches SP1-SPm, SN1-SNm of the comparator circuit COMP2 to be ON and OFF.

Further, the correction circuit 32 outputs a control signal CONT11 to the switch group 34, to control the switches SW11-SW22 to be ON and OFF.

Also, based on the output voltage VOP1 of the comparator circuit COMP1 and the output voltage VOP2 of the comparator circuit COMP2, the correction circuit 32 outputs a control signal CONT12 to the common voltage generator circuit 33, to control the common voltage Vcm.

Further, based on the output voltage VOP1 of the comparator circuit COMP1 and the output voltage VOP2 of the comparator circuit COMP2, the correction circuit 32 outputs a control signal CONT13 to the differential voltage generator circuit 35, to control the differential voltage Vd.

First, the input capacitors C11, C12 are connected to the reference power supply GND via the switches SW18, 17, respectively. The input capacitors C12, C22 are connected to the reference power supply GND via the switches SW16, 15, respectively.

Thereafter, the common voltage generator circuit 33 is connected via the switches SW21, 22 to the input terminals T21, T11 of the comparator circuit COMP1, respectively. The common voltage generator circuit 33 is connected via the switches SW19, 20 to the input terminals T22, T12 of the comparator circuit COMP2, respectively.

Further, the differential voltage generator circuit 35 is connected to the input capacitors C11, C21 via the switches SW11, SW12, respectively. Also, the differential voltage generator circuit 35 is connected to the input capacitors C12, C22 via the switches SW13, SW14, respectively.

As such, in the comparator 30, each pair of input terminals of the comparator circuits COMP1, COMP2 is connected to each pair of input capacitors, and is connected to the common voltage generator circuit 33 via switches, and each pair of input capacitors is connected to the reference power supply GND and the differential voltage generator circuit 35 via switches. Incidentally, when the number of comparator circuits included in the comparator 30 is either a single or a plural more than and including three, each pair of input terminals of the comparator circuit included in the comparator 30 is connected to the common voltage generator circuit 33, each pair of input capacitors, the reference power supply GND and the differential voltage generator circuit 35, in a similar manner to FIG. 11.

[Correction Operation]

Figure 13:
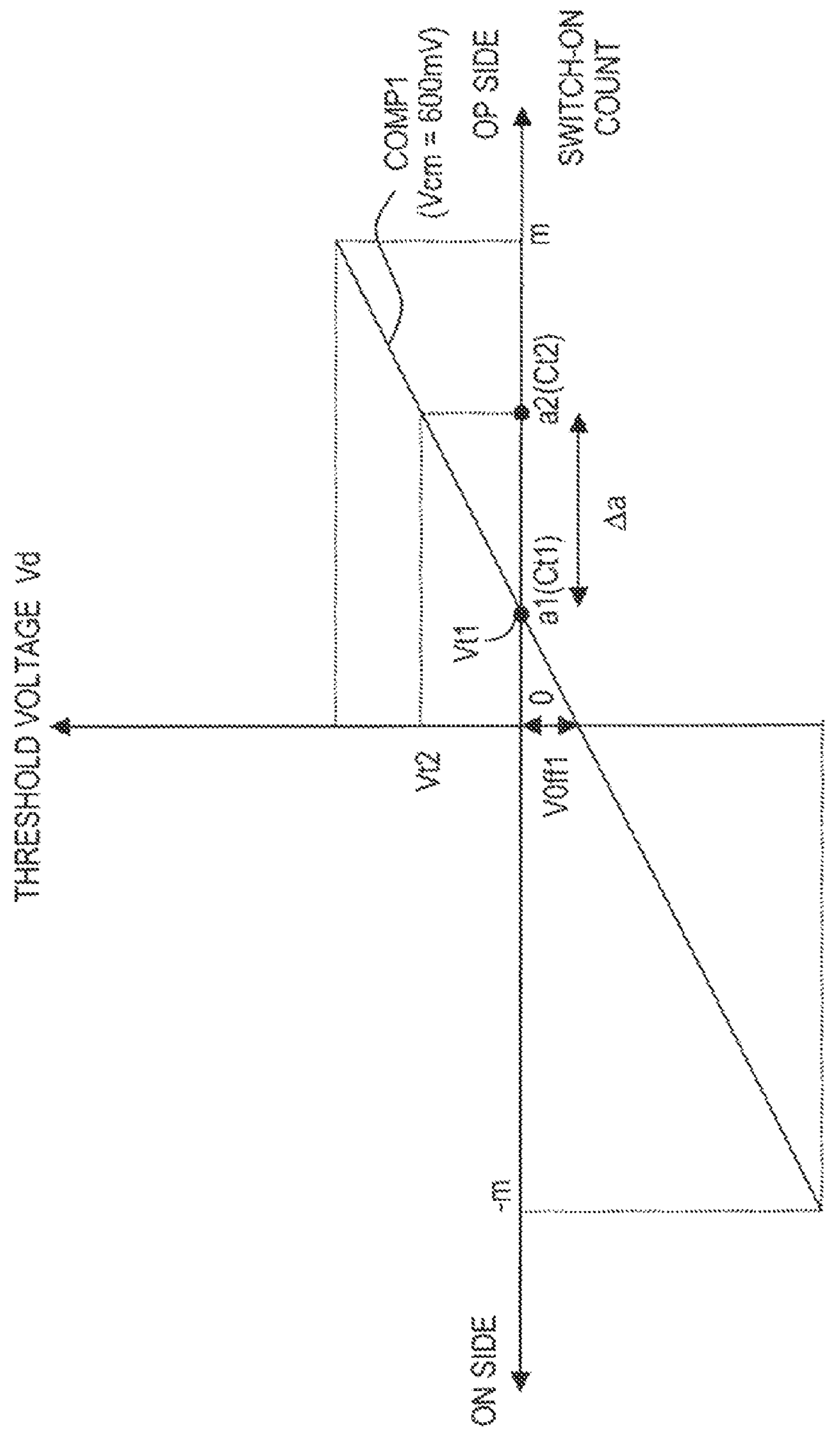
FIG. 13 is a first example of comparator correction operation according to the first embodiment.
Figure 14:
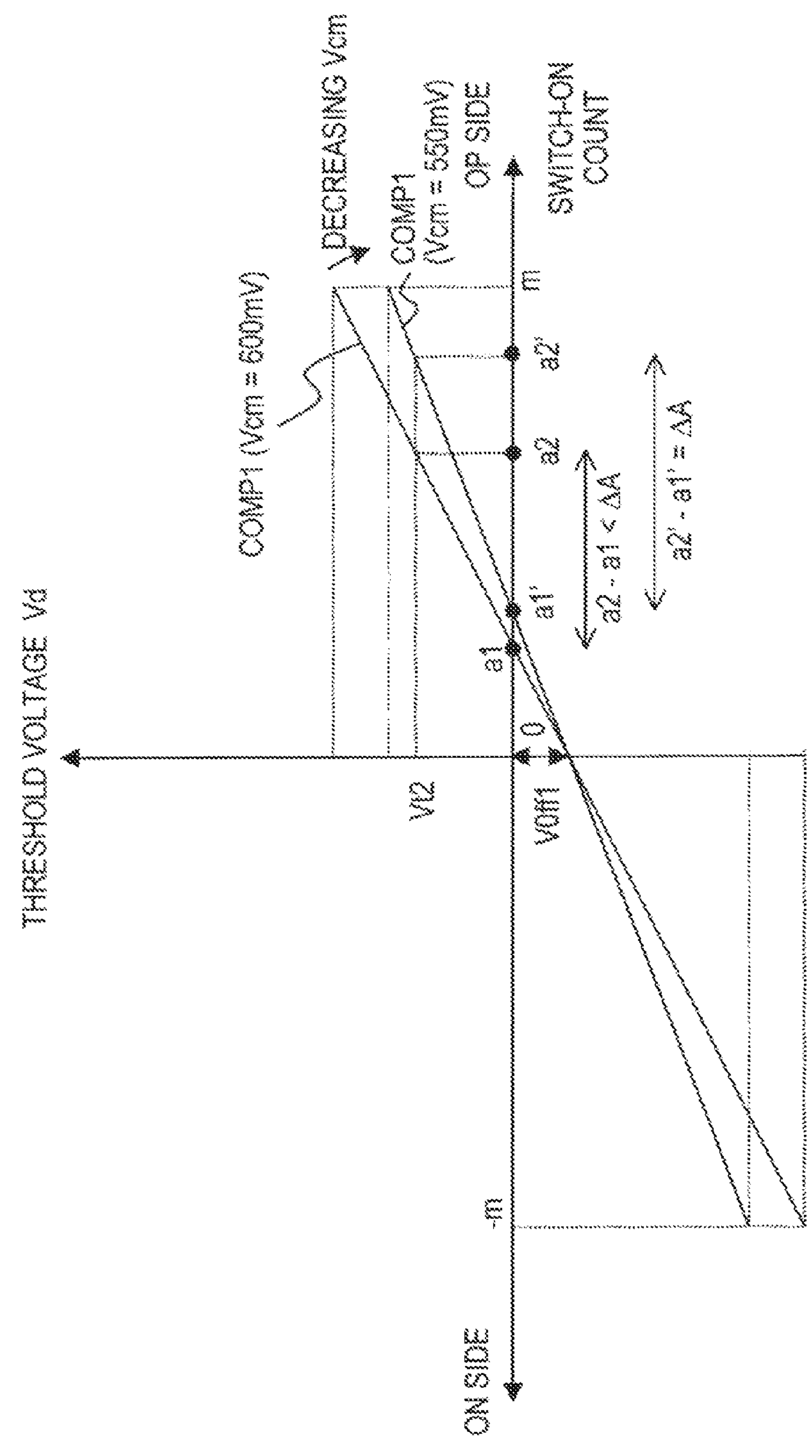
FIG. 14 is a second example of comparator correction operation according to the first embodiment.
Figure 15:
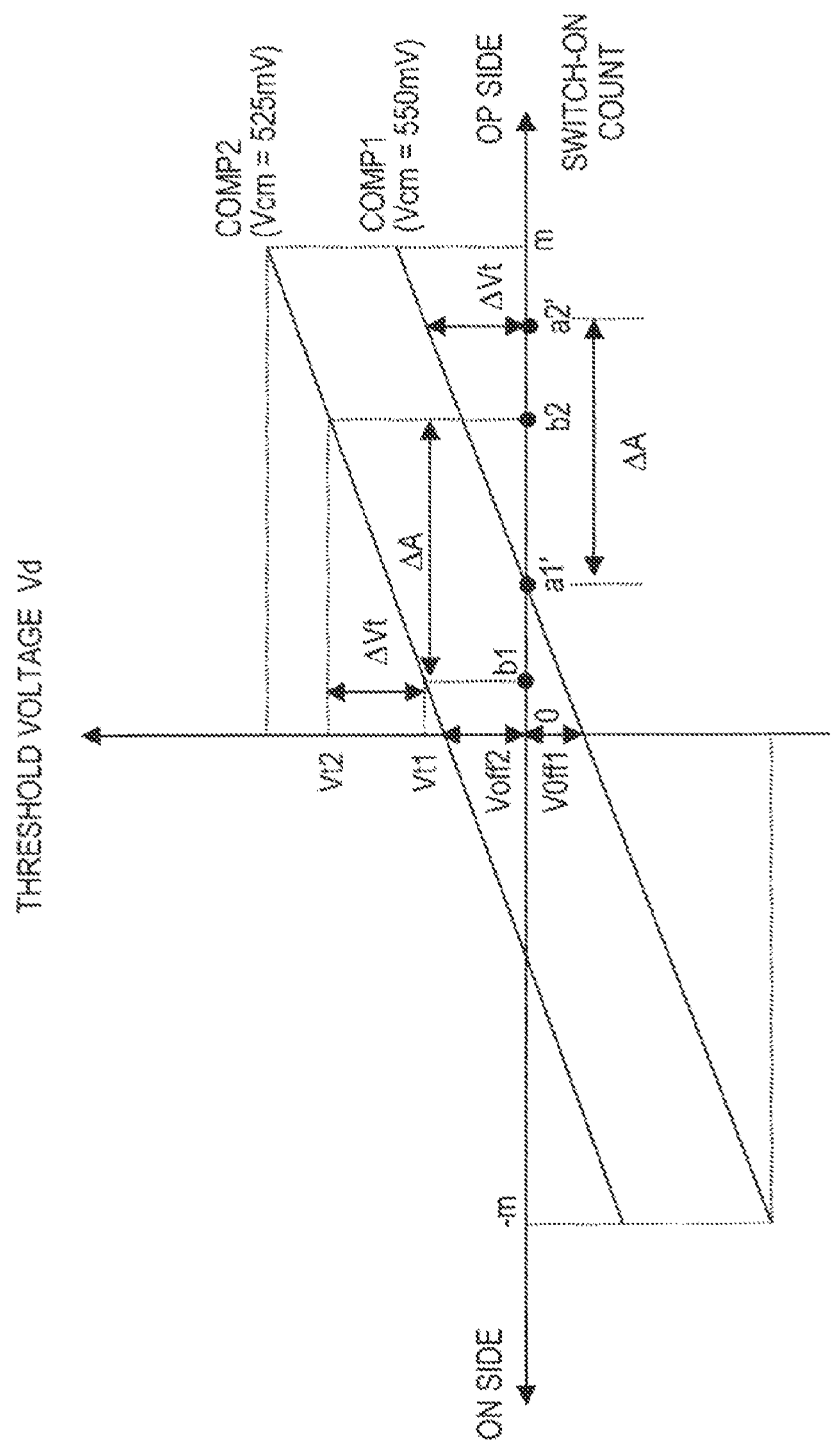
FIG. 15 is a third example of comparator correction operation according to the first embodiment.

Next, by reference to FIGS. 12-15, correction operation according to the first embodiment will be described. FIG. 12 is a flowchart of the correction operation according to the first embodiment. FIG. 13 is a first example of comparator correction operation according to the first embodiment. FIG. 14 is a second example of comparator correction operation according to the first embodiment. FIG. 15 is a third example of comparator correction operation according to the first embodiment.

For each comparator circuit COMP1, COMP2, the comparator 30 performs correction operation depicted in FIG. 12, and detects a corrected common voltage Vcmc that produces a difference between a capacitance value Ct1 (first capacitance value) of the variable capacitors connected to the output terminal, by which the threshold voltage Vb becomes a first voltage difference Vt1, and a capacitance value Ct2 (second capacitance value) of the variable capacitors connected to the output terminal, by which the threshold voltage Vb becomes a second voltage difference Vt2, to be a reference capacitance value difference ΔCt. Here, the second voltage difference Vt2 is different from the first voltage difference Vt1 by as large as a predetermined voltage value ΔVt.

By this, using the corrected common voltage Vcmc corresponding to each comparator circuit COMP1, COMP2, the comparator 30 equalizes the variation amount of the threshold voltage Vb relative to the capacitance value of the variable capacitors connected to the output terminal in the comparator circuit COMP1 to the variation amount of the threshold voltage Vb relative to the capacitance value of the variable capacitors connected to the output terminal in the comparator circuit COMP2. In other words, by setting the corrected common voltages Vcmc through CONT12 to the comparator circuit COMP1, 2 via the control signal CONT12 controlled by the correction circuit 32, the comparator 30 equalizes the inclination of the variation line of the comparator circuit COMP1 to the inclination of the variation line of the comparator circuit COMP2.

Hereafter, detailed correction operation will be described.

[First Correction Operation in S11]

First, the correction circuit 32 in the comparator 30 detects the capacitance value Ct1 of the variable capacitors by which the threshold voltage Vb of the comparator circuit COMP1 becomes equal to the first voltage difference Vt1 (step S11 (first correction operation) depicted in FIG. 12). For example, as depicted in FIG. 13, the correction circuit 32 detects the number of connections a1 of variable capacitors by which the threshold voltage Vb of the comparator circuit COMP1 is 0 V (first voltage difference Vt1). In the first correction operation, the correction circuit 32 maintains the difference voltage Vd to be Vt1=0V, and changes the number of connection of the variable capacitors to detect the connection number (a1, Ct1) at which the output voltage VOP switches between H/L levels. The connection number (a1, Ct1) corresponds to the threshold voltage Vb of Vt1=0V.

In concrete, first in step S11, the correction circuit 32 depicted in FIG. 11 maintains the common voltage Vcm to be an arbitrary voltage (for example, 600 mV), switches ON the switches SW21, SW22 with the switches SW17, SW18 being ON state, and also switches OFF the switches SW11-SW16, SW19 and SW20. By this, the common voltage Vcm of 600 mV is supplied to the input capacitors C11, C21, and the input capacitor C11, C21 are charged to the common voltage Vcm.

Next, the correction circuit 32, after switching OFF SW13-SW22, switches ON SW11, SW12. Also, the correction circuit 32 maintains the difference voltage Vd to be 0 V (=Vt1). As a result, a difference between the input voltages VIP, VIN of the comparator circuit COMP1 is maintained to be 0 V.

Then, based on the potential level of the output voltage VOP1 of the comparator circuit COMP1, the correction circuit 32 controls the switches SP1-SPm, SN1-SNm of the comparator circuit COMP1 to be ON and OFF. By this, the correction circuit 32 detects the number of connections a1 of the variable capacitors when the potential level of the output voltage VOP1 is switched, in other words, detects a capacitance value Ct1 (first capacitance value) of the variable capacitors when the threshold voltage Vb is 0 V (first voltage difference).

[Second Correction Operation in S12]

After step S11 depicted in FIG. 12, similar to step S11, the correction circuit 32 detects a capacitance value Ct2 of the variable capacitors by which the threshold voltage Vb of the comparator circuit COMP1 becomes equal to the second voltage difference Vt2 (step S12 (second correction operation). For example, in FIG. 13, the correction circuit 32 detects the number of connections a2 of variable capacitors by which the threshold voltage becomes equal to the second voltage difference Vt2. In the second correction operation, the correction circuit 32 maintains the difference voltage Vd to be Vt2, and changes the number of connection of the variable capacitors to detect the connection number (a2, Ct2) at which the output voltage VOP switches between H/L levels. The connection number (a2, Ct2) corresponds to the threshold voltage Vb of Vt2.

In concrete, first in step S12, the correction circuit 32 maintains the common voltage Vcm to be 600 mV, which is the same as in step S11, and switches ON the switches SW21, SW22 with the switches SW17, SW18 being ON state, and also switches OFF the switches SW11-SW16, SW19 and SW 20. By this, the common voltage Vcm of 600 mV is supplied to the input capacitors C11, C21, and the input capacitors C11, C21 are charged to the common voltage Vcm.

Next, the correction circuit 32 switches OFF SW13-SW22, and switches ON SW11, SW12. Also, the correction circuit 32 maintains the differential voltage Vd to be the second voltage difference Vt2. As a result, a difference between the input voltages VIP, VIN of the comparator circuit COMP1 is maintained to be the second voltage difference Vt2.

Then, based on the potential level of the output voltage VOP1 of the comparator circuit COMP1, the correction circuit 32 controls the switches SP1-SPm and SN1-SNm to be ON and OFF. By this, the correction circuit 32 detects the number of connections a2 of the variable capacitors when the potential level of the output voltage VOP1 is switched, that is, a capacitance value Ct2 (second capacitance value) of the variable capacitors by which the threshold voltage Vb becomes equal to the second voltage difference Vt2.

[S13]

Then, the correction circuit 32 detects common voltage Vcm by which the inclination of the variation line (Vt2−Vt1)/(Ct2−Ct1) of the comparator circuit COMP1 is equal to a predetermined inclination. After steps S11 and S12 depicted in FIG. 12, the correction circuit 32 decides whether or not a difference between the capacitance value Ct1 of the variable capacitors when the threshold voltage Vb is the first voltage difference and the capacitance value Ct2 of the variable capacitors when the threshold voltage Vb is the second voltage difference is equal to a predetermined capacitance value difference ΔCt (step S13 in FIG. 12). In other words, the correction circuit 32 decides whether the inclination (Vt2−Vt1)/(Ct2−Ct1) is equal to (Vt2−Vt1)/ΔCt2 or not. For example, in FIG. 13, the correction circuit 32 obtains a difference Δa between the number of connections a1 and a2, and decides whether or not the difference Δa is equal to a reference value ΔA.

[S15]

If a2−a1=ΔA, namely, if Ct2−Ct1=ΔCt2 (Yes in step S14 in FIG. 12), the correction circuit 32 controls (detects and corrects) the common voltage Vcm used in steps S11 and S12 to be a corrected common voltage Vcmc and set the corrected common voltage Vcmc (S15 in FIG. 12). Accordingly, in the example depicted in FIG. 13, the corrected common voltage Vcmc equals 600 mV.

[S14]

If a2−a≠ΔA, namely, if Ct2−Ct1≠ΔCt2 (No in step S13 in FIG. 12), the correction circuit 32 changes the voltage of the common voltage Vcm to increase or decrease, depending on whether or not Ct2−Ct1 is larger than ΔCt (S14 in FIG. 12). Thereafter, the correction circuit 32 executes steps S11-S13 again.

For example, in the example depicted in FIG. 14, when the correction circuit 32 changes the common voltage Vcm from 600 mV to 550 mV on the basis that Ct2−Ct1 is smaller than ΔCt, the inclination of the variation line of the comparator circuit COMP1 becomes gentler around a case when the number of connected variable capacitors is zero, as depicted in FIG. 14. Then, the correction circuit 32 detects the number of connections a1' of the variable capacitors by which the threshold voltage Vb of the comparator circuit COMP1 becomes 0V (first voltage difference Vt1) and the number of connections a2' of the variable capacitors by which the threshold voltage Vb of the comparator circuit COMP1 becomes equal to the second voltage difference Vt2 (steps S11 and S12 in FIG. 12).

Further, the correction circuit 32 decides whether or not a difference a2'−a1' is ΔA (step S13 in FIG. 12). If the difference a2'−a1'=ΔA (Yes in step S13 in FIG. 12), the correction circuit 32 controls the common voltage Vcm to be 550 mV, as a corrected common voltage Vcmc (step S15 in FIG. 12), to set the corrected common voltage Vcmc. If the difference a2'−a1'≠ΔA (No in step S13 in FIG. 12), the correction circuit 32 changes the common voltage Vcm and executes steps S11-S13 again.

As such, the correction circuit 32 executes steps S11-S14 repeatedly while changing the common voltage Vcm until it controls the common voltage Vcm to be the corrected common voltage Vcmc that produces Ct2−Ct1=ΔCt (Yes in step S13 and step S15 in FIG. 12).

After the correction circuit 32 controls the common voltage Vcm of the comparator circuit COMP1 to be the corrected common voltage Vcmc in the above-mentioned manner, the correction circuit 32 similarly executes correction operation of steps S11-S15 on the comparator circuit COMP2 also, to control (or detect) the common voltage Vcm to be the corrected common voltage Vcmc, so as to correct each common voltage Vcm of both comparator circuits COMP1, COMP2 to the controlled (detected) common voltage Vcmc (step S15 in FIG. 12).

Incidentally, in regard to the above-mentioned control of the common voltage Vcm, the correction circuit 32 may control (detect and correct) the common voltages of each comparator circuit in a manner that each inclination of the variation lines indicating proportional relation of the threshold voltage Vb to the capacitance value of the variable capacitors is coincident with each other. Therefore, each voltage value of the first voltage difference Vt1 and the second voltage difference Vt2 used in the correction operation of the comparator circuit COMP2 may be different from each voltage Vt1, Vt2 used in the correction operation of the comparator circuit COMP1. However, the predetermined voltage value difference ΔVt and the predetermined capacitance value difference ΔCt (reference value ΔA) of the comparator circuit COMP2 is set to be equal to each value used in the correction operation of the comparator circuit COMP1. And at least, the ratio ΔVt/ΔCt is set to be equal to each other between the comparator circuit COMP1, COMP2.

As an example, FIG. 15 illustrates the variation line of the comparator circuit COMP2 as a result of the correction operation of steps S11-S15 on the comparator circuit COMP2 executed by the correction circuit 32. In the figure, in the case when the common voltage Vcm is 525 mV, there is a difference ΔA between the number of connections b1 of variable capacitors by which the threshold voltage Vb becomes equal to the first voltage difference Vt1 higher than 0 V and the number of connections b2 of variable capacitors by which the threshold voltage Vb becomes equal to the second voltage difference Vt2 higher by ΔVt than the first voltage difference Vt1. Namely, the corrected common voltage Vcmc2 of the comparator circuit COMP2 is 525 mV for example.

FIG. 15 also illustrates the variation line of the comparator circuit COMP1 after correction operation for the comparator circuit COMP1 (corrected common voltage Vcmc1=550 mV for example).

As depicted in FIG. 15, in each comparator circuit COMP1, COMP2 after the correction operation, each variation amount of the threshold voltage Vb relative to the variation amount ΔA of the number of connections of variable capacitors becomes ΔVt. Therefore, the inclinations of the variation lines of the comparator circuit COMP1, COMP2 are equal.

In such a manner, the correction circuit of the comparator 30 equalizes the inclinations of the variation lines by controlling (detecting and correcting) the common voltage Vcm to be the corrected common voltage Vcmc on the basis of each comparator circuit.

On completion of the correction operation, the correction circuit 32 of the comparator 30 outputs a control signal CONT12 to the common voltage generator circuit 33 so that the corrected common voltage Vcmc1=550 mV is set to the comparator circuit COMP1 and the corrected common voltage Vcmc2=525 mV is set to the comparator circuit COMP2. While setting as above, the correction circuit 32 of the comparator 30 generates control signals CPa11-CPa1*m*, CNa11-CNa1*m*, CPa21-CPa2*m* and CNa21-CNa2*m* so that the threshold voltage Vb of each comparator circuit becomes a desired voltage, and controls to switch the switches SP1-SPm, SN1-SNm ON and OFF in each comparator circuit. The correction circuit 32 decides the control signals for the switches SP1-SPm, SN1-SNm based on the Vt1, Vt2, Ct1 and Ct2. As a result, the capacitance value of the variable capacitors in each comparator circuit is corrected to produce each desired threshold voltage. Then, the corrected comparator circuits COMP1, COMP2 are used for the flash AD converter 10 etc. depicted in FIG. 1, for example. More specifically, when the comparator circuits COMP1, COMP2 on which the correction operation is completed are used for the flash AD converter 10 etc. depicted in FIG. 1, control is carried out in the following manner. Namely, in place of the output signal of the differential voltage generator circuit 35 depicted in FIG. 11, an external input signal is input using a switch circuit (not illustrated), for example, in a state of maintaining the corrected common voltage and the outputs of the control signals CPa11-CPa1*m*, CNa11-CNa1*m*, CPa21-CPa2*m*, CNa21-CNa2*m* of the switches SP1-SPm, SN1-SNm in each comparator circuit. Thus, the comparator circuit COMP1, COMP2 is appropriately used for the flash AD converter 10 etc. depicted in FIG. 1.

[Concrete Example of Correction Operation]

Next, as a concrete example of the correction operation depicted in FIG. 12, the correction operation of the comparator 30 for the comparator circuit COMP1 will be described using FIGS. 16-20.

FIG. 16 is a flowchart illustrating a concrete example of the correction operation of the comparator according to the first embodiment. FIG. 17 is a diagram illustrating a common voltage generated by the common voltage generator circuit to a control signal CONT12.

FIG. 16 is the flowchart of comparator correction operation. In this example, the comparator circuit COMP1 includes 32 variable capacitors (m=32) on each of the output terminal OP side and the output terminal ON side. In FIG. 16, the reference value ΔA is set to be 16 (=m/2), which is half the total number of variable capacitors. As depicted in FIG. 17, the common voltage generator circuit can generate 32 types of common voltages Vcm on the basis of the control signal CONT12 of the correction circuit 32.

The correction circuit 32 sets the number of execution times n to be an initial value "0", and after executing step S21, executes steps S22-S27 five times repeatedly (n=0 to 4), to control (detect) the common voltage Vcm to be the corrected common voltage Vcmc. Here, a reason for setting the number of execution times to be 5 is that, as will be described later, the correction circuit 32 executes a binary search method to decide the corrected common voltage Vcmc by which a difference between the number of connections a1 and a2 becomes a reference value ΔA=16, i.e. the inclination, (Vt2−Vt1)/(Ct2−Ct1) becomes a determined value, while changing the voltage value of the 32 (=$2^5$) kinds of common voltage Vcm to increase or decrease.

First, the correction circuit 32 outputs to the common voltage generator circuit 33 a control signal CONT12 that indicates a common voltage set value "16" as an initial value (S21 in FIG. 16). Here, as depicted in FIG. 17, the control signal CONT12 indicative of the common voltage set value "16" corresponds to the center value 600 mV of the variable range of the common voltage Vcm. By this, the common voltage generator circuit 33 generates a common voltage 600 mV on the basis of the control signal CONT12 indicative of the common voltage set value "16".

Next, the correction circuit 32 detects the number of connections a1 of variable capacitors by which the threshold voltage Vb becomes equal to the first voltage difference Vt1 (step S22 in FIG. 16). For example, the correction circuit 32 executes operation depicted in FIG. 18.

FIG. 18 is a flowchart illustrating detection operation (S22, S23 in FIG. 16) of the number of connections of variable capacitors relative to a predetermined threshold voltage according to the first embodiment. The correction circuit 32 sets the number of execution times i to be an initial value "0" and after executing step S31, executes steps S32-S35 six times repeatedly (i=0 to 5), to detect the number of connections a1 of variable capacitors by which the threshold voltage Vb becomes equal to the first voltage difference Vt1. Here, a reason for setting the number of execution times to be 6 is that, as will be described later, the correction circuit 32 executes a binary search method to decide the potential value of the output voltage VOP, while changing the number of connections of the 64 (=$2^6$) kinds of variable capacitors to increase or decrease.

First, the correction circuit 32 maintains the voltage difference Vd to Vt1 in the step S22, and outputs control signals CPa11-CPa1*m*, CNa11-CNa1*m* to the comparator circuit COMP1, to control the number of variable capacitors connected to each output terminal OP, ON to be zero (step S31 in FIG. 18). Namely, the correction circuit 32 controls the number of connections of variable capacitors to be the center value of a controllable number (from −32 to +32) of connections.

Then, the correction circuit 32 maintains the common voltage Vcm of 600 mV, which is set in step S21 in FIG. 16 described above, to execute operation similar to step S11 in FIG. 12 described above, and decide whether or not the potential level of the output voltage VOP is L level (step S32 in FIG. 18).

If the output voltage VOP is at L level (Yes in step S32 in FIG. 18), the correction circuit 32 increases the number of connections of variable capacitors by X1 (the number of connections=0+X1) to connect variable capacitors to the positive output terminal OP side of the comparator circuit COMP1 (step S33 in FIG. 18). On the other hand, if the output voltage VOP is not at L level (No in step S32 in FIG. 18), the correction circuit 32 decreases the number of connections of variable capacitors by X2 (the number of connections=0−X2) to connect variable capacitors to the negative output terminal ON side of the comparator circuit COMP1 (step S34 in FIG. 18). Typical numbers of X1 and X2 are described in FIG. 19.

FIG. 19 is a diagram illustrating increase and decrease values of the number of connections of variable capacitors for each number of execution times according to the first embodiment. For example, if the output voltage VOP is at L level when the number of execution times i=0 (Yes in step S32 in FIG. 18), the correction circuit 32 sets the number of connections of variable capacitors to be 0+16=16 (step S33 in FIG. 18). Namely, 16 variable capacitors are connected to the output terminal OP. On the other hand, if the output voltage VOP is not at L level when the number of execution times i=0 (No in step S32 in FIG. 18), the correction circuit 32 sets the number of connections of variable capacitors to be 0−16=−16 (step S34 in FIG. 18). Namely, 16 variable capacitors are connected to the output terminal ON.

Referring back to FIG. 18, after step S33 or S34, if the number of execution times i=0 (No in step S35 in FIG. 18), the correction circuit 32 adds 1 to the number of execution times i, to make the number of execution times i=1 (step S36 in FIG. 18) and then, returning to step S32, the correction circuit 32 decides the potential level of the output voltage VOP in a state that the number of connections of variable capacitors is changed in step S33 or S34. The correction circuit 32 set the connection number to +X1 (+8) or −X2 (−8) depending on the decision in S32. $8=2^{4-i}$ (i=1).

For example, if the output voltage VOP is at L level when the number of execution times i=0 and also the output voltage VOP is at L level when the number of execution times i=1 (Yes in step S32 in FIG. 18), the correction circuit 32 obtains X1=8 from FIG. 19, to determine the number of connections of variable capacitors to be 16+8=24 (step S33 in FIG. 18). Namely, 24 variable capacitors are connected to the output terminal OP. Also, if the output voltage VOP is at L level when the number of execution times i=0 and the output voltage VOP is at H level when the number of execution times i=1 (No in step S32 in FIG. 18), the correction circuit 32 obtains X2=8 from FIG. 19, to determine the number of connections of variable capacitors to be 16−8=8 (step S34 in FIG. 18). Namely, 8 variable capacitors are connected to the output terminal OP.

As such, based on the potential level of the output voltage VOP and the value of the execution times i, the correction circuit 32 adds X1 ($=2^{4-i}$) to or subtracts X2 ($=2^{4-i}$) from the number of connections of variable capacitors. If the number of connections obtained by the above addition or subtraction has a positive value, the correction circuit 32 connects variable capacitors in number equal to the obtained value, to the output terminal OP side, whereas if the number of connections has a negative value, the correction circuit 32 connects variable capacitors in number equal to the obtained value, to the output terminal ON side. By this, the correction circuit 32 detects the capacitance value of the variable capacitors of the comparator circuit COMP1.

Further, because the comparator circuit COMP1 includes 32 variable capacitors on each of the output terminal OP side and the output terminal ON side, by repeating the operation of adding X1 or subtracting X2 depicted in FIG. 19 six times by the binary search, the correction circuit 32 detects the number of connections a1 of variable capacitors for the threshold voltage Vb that produces the first voltage difference Vt1.

The correction circuit 32, after repeating steps S32-S35 six times (Yes in step S35 in FIG. 18), detects the number of connections of variable capacitors at that time point as the number of connections a1 of variable capacitors by which the threshold voltage Vb becomes equal to the first voltage difference Vt1, and completes the detection operation depicted in FIG. 18.

Referring back to FIG. 16, after step S22, the correction circuit 32 executes the above-mentioned detection operation depicted in FIG. 18 in regard to the threshold voltage Vb of the second voltage difference Vt2, to detect the number of connections a2 of variable capacitors by which the threshold voltage Vb becomes equal to the second voltage difference (step S23 in FIG. 16). In the step S22, the correction circuit 32 maintains the voltage difference Vd to Vt2, and detects the connection number a2 of the variable capacitors at which the output voltage VOP switches H/L levels.

Then, the correction circuit 32 decides whether or not a difference a2−a1 between the number of connections a1 and a2 is larger than 15 (step S24 in FIG. 16).

If a2−a1 is larger than 15 (Yes in step S24 in FIG. 16), the correction circuit 32 adds X3 to the common voltage set value of the control signal CONT12, to change the common voltage to increase (step S25 in FIG. 16). By this, the inclination of the variation line of the threshold voltage Vb increases.

If a2−a1 is smaller than and including 15 (No in step S24 in FIG. 16), the correction circuit 32 subtracts X4 from the common voltage set value of the control signal CONT12, to change the common voltage to decrease (step S26 in FIG. 16). Here, concrete values of X3, X4 are $4=2^{3-n}$ as described in FIG. 20. By this, the inclination of the variation line of the threshold voltage Vb decreases.

FIG. 20 is a diagram illustrating an example of each increase/decrease value of the common voltage set value for each number of execution times, according to the first embodiment. For example, if a2−a1 is larger than 15 when the number of execution times n=0 (Yes in step S24 in FIG. 16), the correction circuit 32 outputs a control signal CONT12 indicative of a common voltage set value of "24" that is obtained by adding X3="8" to the common voltage set value "16" of the control signal CONT12 (step S25 in FIG. 16). By this, the common voltage generator circuit 33 generates a common voltage Vcm of 645 mV (FIG. 17). The common voltage Vcm=645 mV is a voltage that corresponds to a center value X4="24" between the common voltage set values "16" and "31", as described in the table on the right side in FIG. 17.

On the other hand, if a2−a1 is smaller than and including 15 when the number of execution times n=0 (No in step S24 in FIG. 16), the correction circuit 32 outputs a control signal CONT12 indicative of a common voltage set value of "8" that is obtained by subtracting "8" from the common voltage set value "16" of the control signal CONT12 (step S26 in FIG. 16). By this, the common voltage generator circuit 33 generates a common voltage Vcm of 560 mV (FIG. 17). The common voltage Vcm=560 mV is a voltage that corresponds to a center value "8" between the common voltage set values "0" and "15", as described in the table on the left side in FIG. 17.

Referring back to FIG. 16, after step S25 or S26, when the number of execution times n=0 (No in step S27 in FIG. 16), the correction circuit 32 adds 1 to the number of execution times n, to obtain the number of execution times n=1 (step S28 in FIG. 16). Then, returning to step S22, the correction circuit 32 execute steps S22-S24 in a state that the common voltage Vcm is changed in step S25 or S26.

Then, for example, in step S24, if a2−a1 when the number of execution times n=0 is larger than 15, and also a2−a1 when the number of execution times n=1 is larger than 15 (Yes in step S24 in FIG. 16), the correction circuit 32 outputs a control signal CONT12 indicative of a common voltage set value "28" that is obtained by adding $X3=2^{3-n}$="4" to the common voltage set value "24" of the control signal CONT12 (step S25 in FIG. 16). By this, the common voltage generator circuit 33 generates a common voltage Vcm of 665 mV (FIG. 17). On the other hand, if a2−a1 when the number of execution times n=0 is larger than 15, and a2−a1 when the number of execution times n=1 is smaller than and including 15 (No in step S24 in FIG. 16), the correction circuit 32 outputs a control signal CONT12 indicative of a common voltage set value "20" that is obtained by subtracting $X4=2^{3-n}$="4" from the common voltage set value "24" of the control signal CONT12 (step S26 in FIG. 16). By this, the common voltage generator circuit 33 generates a common voltage Vcm of 625 mV (FIG. 17).

As such, based on a2−a1 and the value of the execution times n, the correction circuit 32 adds X3 to or subtracts X4 from the common voltage set value of the control signal CONT12, to control the common voltage Vcm generated by the common voltage generator circuit 33.

The common voltage generator circuit 33 generates 32 types of common voltages Vcm on the basis of the control signal CONT12, and therefore, by repeating the operation S24, S25 and S26 of adding X3 and subtracting X4 depicted in FIG. 20, the correction circuit 32 controls (detects) the corrected common voltage Vcmc to be a common voltage Vcm in which a2−a1 becomes equal to the reference value ΔA=16.

The correction circuit 32, after repeating steps S22-S27 five times (Yes in step S27 in FIG. 16), controls the common voltage Vcm at that time point to be a corrected common voltage Vcmc, and completes the correction operation depicted in FIG. 16.

As having been described above, according to the first embodiment, the correction circuit 32 first controls the voltage difference Vd between the input voltages VIP and VIN to be a first voltage difference Vt1, and controls the capacitance value of the variable capacitors of the comparator circuit, so as to detect a first capacitance value Ct1 by which the potential level of the output voltage VOP of the comparator circuit is reversed (first correction operation). Next, the correction circuit 32 controls the voltage difference Vd between the input voltages VIP and VIN to be a second voltage difference Vt2 (=Vt1+ΔVt), and controls the capacitance value of variable capacitors of the comparator circuit, so as to detect a second capacitance value Ct2 by which the potential level of the output voltage VOP of the comparator circuit is reversed (second correction operation). Then, the correction circuit 32 repeats the first and second correction operation by changing the common voltage Vcm until controlling (detecting) the corrected common voltage Vcmc by which a difference between the first capacitance value Ct1 and the second capacitance value Ct2 becomes equal to a predetermined capacitance value difference ΔCt. By the execution of controlling (detecting and correcting) the common voltage Vcm for each comparator circuit, the correction circuit 32 makes coincident the inclinations of the variation lines of the threshold voltages of each comparator circuit. Thus, for example, the corrected comparator circuit COMP1 and COMP2 are used for the flash AD converter 10 etc. depicted in FIG. 1.

Second Embodiment

In a second embodiment, the comparator 30 depicted in FIG. 11 performs correction operation depicted in FIG. 21 for each comparator circuit COMP1, COMP2, to control (detect and correct) the common voltage Vcm to a corrected common voltage Vcmc that produces a difference between a capacitance value Ct1 (first capacitance value) of variable capacitors connected to the output terminal, by which the threshold voltage Vb becomes a first voltage difference Vt1, and a capacitance value Ct2 (second capacitance value) of variable capacitors connected to the output terminal, by which the threshold voltage Vb becomes a second voltage difference Vt2, to be a predetermined capacitance value difference ΔCt. However, in the first embodiment in FIG. 12, the correction circuit 32 detects the capacitance value Ct1 at which the output voltage VOP switches while maintaining Vd=Vt1 in S12, and determines if Ct2−Ct1=ΔCt. One the other hand, in the second embodiment in FIG. 21, the correction circuit 32 maintains Ct2=Ct1+ΔCt and Vd=Vt2 in S42, detects whether Vt2 is a threshold voltage Vd at which the output voltage VOP switches, depending on the output voltage VOP being H or L in S43, and increase or decrease the common voltage Vcm depending on VOP level, until detecting Vt2 is coincident to the threshold voltage Vb.

Figure 22:
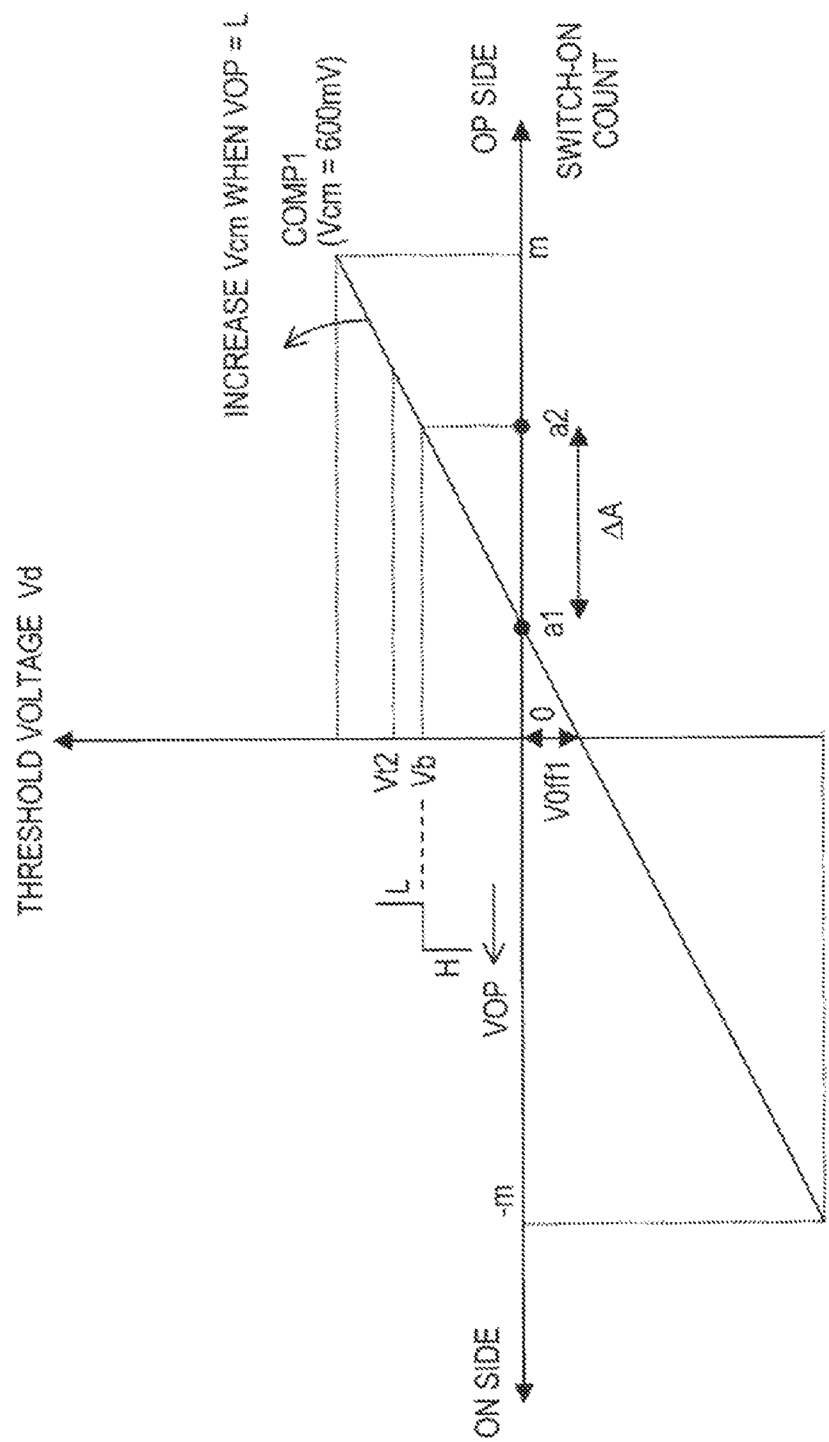
FIG. 22 is a diagram illustrating an example of the correction operation according to the second embodiment.

FIG. 21 is a diagram illustrating a flowchart of correction operation according to the second embodiment. FIG. 22 is a diagram illustrating an example of the correction operation according to the second embodiment.

[S41]

First, the correction circuit 32 of the comparator 30, after setting the common voltage Vcm at an initial value, obtains the capacitance value Ct1 of the variable capacitors by which the threshold voltage Vb of the comparator circuit COMP1 becomes equal to a first voltage difference Vt1 (step S41 (first correction operation) depicted in FIG. 21). For example, as depicted in FIG. 22, the correction circuit 32 detects the number of connections a1 of variable capacitors when the threshold voltage Vb of the comparator circuit COMP1, to which the common voltage of the initial value of 600 mV is supplied, is 0 V (first voltage difference Vt1). In other words, the first correction operation S41, the correction circuit 32 maintains the difference voltage Vd to Vt1 and changes the number of connection of the variable capacitors to detect the connection number (a1, Ct1) at which the output voltage VOP switches between H/L levels.

Next, the correction circuit 32 sets the capacitance value of the variable capacitors of the comparator circuit COMP1 to be a capacitance value Ct1+ΔCt=Ct2, that is, a value obtained by adding ΔCt to the first capacitance value Ct1 detected in step S41, and sets the voltage difference dV to be the second voltage difference Vt2 (step S42 in FIG. 21 (second correction operation)). For example, the correction circuit 32 sets the number of variable capacitors connected to the output terminal of the comparator circuit COMP1 to be a1+ΔA=a2, that is, a value obtained by adding the reference value ΔA to the number of connections a1 detected in step S41. Then, the correction circuit 32 controls the differential voltage Vd of the differential voltage generator circuit 35 in such a manner that a voltage difference between the input voltages VIP1 and VIN1 of the comparator circuit COMP1 becomes equal to a second voltage difference Vt2. That is, in the step S42, it is not necessary to detect the variable capacitor value Ct2 while changing the number of connection of the variable capacitors.

After step S42, the correction circuit 32 decides whether or not the threshold voltage Vb when the capacitance value of variable capacitors is Ct2 is equal to the second voltage difference Vt2 based on the output voltage VOP (step S43 in FIG. 21). In other words, as depicted in FIG. 22, the correction circuit 32 decides whether or not the second voltage difference Vt2 when the number of connections of variable capacitors is a2 is equal to the threshold voltage Vb.

If the threshold voltage Vb is equal to the second voltage difference Vt2 (Yes in step S43 in FIG. 21), the correction circuit 32 controls the common voltage Vcm, which is used in steps S41 and S42, to be a corrected common voltage Vcmc (step S45 in FIG. 21).

If the threshold voltage Vb is not equal to the second voltage difference Vt2 (No in step S43 in FIG. 21), the correction circuit 32 changes the voltage value of the common voltage Vcm to increase or decrease, on the basis of the voltage value of the output voltage VOP (step S44 in FIG. 21). Then, the correction circuit 32 executes step S41-S43 again.

For example, in FIG. 22, the threshold voltage Vb when the number of connections of variable capacitors is a2 is lower than the second voltage difference Vt2, and therefore, the output level of the output voltage VOP detected by the correction circuit 32 in step S42 becomes L level. Then, the correction circuit 32 controls the common voltage Vcm to be a voltage higher than 600 mV (step S44 in FIG. 21), by which the inclination of the variation line of the threshold voltage becomes larger. Then, the correction circuit 32 executes step S41-S43 again.

As such, the correction circuit 32 repeats steps S41-S44 until the correction circuit 32 controls (detects) the common voltage Vcm to be the corrected common voltage Vcmc by which the threshold voltage Vb when the capacitance value of variable capacitors is Ct2 becomes equal to the second voltage difference Vt2 (Yes in step S43 in FIG. 21), in other words, until the correction circuit 32 controls (detects) the common voltage Vcm to be the corrected common voltage Vcmc by which the output level of the output voltage VOP is exactly switched when changing the common voltage Vcm.

The correction circuit 32, after controlling (detecting) the common voltage Vcm of the comparator circuit COMP1 in the above-mentioned manner, similarly performs correction operation of steps S41-S45 on the comparator circuit COMP2, to control (detect) the common voltage Vcm to be a corrected common voltage Vcmc. Thus, the correction circuit 32 performs correction on both comparator circuits COMP1, COMP2 into each controlled common voltage Vcm (step S45 in FIG. 21).

In regard to the above-mentioned control of the corrected common voltage, the control of the common voltage may be performed in such a manner that the variation lines indicative of the proportional relation between the capacitance value of variable capacitors and the threshold voltage Vb in each comparator circuit becomes mutually coincident. Therefore, voltage values of the first voltage difference Vt1 and the second voltage difference Vt2 for use in the correction operation of the comparator circuit COMP2 may be different from the voltage values used in the correction operation of the comparator circuit COMP1. However, the predetermined voltage value difference ΔVt and the predetermined capacitance value difference ΔCt (reference value ΔA), at least the ratio ΔVt/ΔCt, are set to be equal to the values used in the correction operation of the comparator circuit COMP1.

Next, as an example of the correction operation depicted in FIG. 21, the correction operation of the comparator 30 for the comparator circuit COMP1 will be described using FIGS. 23 and 24.

FIG. 23 is a flowchart illustrating a typical example of the correction operation of the comparator according to the second embodiment. FIG. 24 is a diagram illustrating an example of each increase/decrease value of the common voltage set value according to the second embodiment.

FIG. 23 is the flowchart of comparator correction operation when the comparator circuit COMP1 includes variable capacitors of m in number, on each of the output terminal OP side and the output terminal ON side. In FIG. 23, the common voltage generator circuit generates 32 kinds of common voltages Vcm on the basis of the control signal CONT12 of the correction circuit 32, similar to the first embodiment as depicted in FIG. 17.

The correction circuit 32 sets the number of execution times n to be an initial value "0", and after executing step S51, executes steps S52-S57 five times repeatedly (n=0 to 4), to detect the corrected common voltage Vcmc. Here, a reason for setting the number of execution times to be 5 is that, as will be described later, the correction circuit 32 executes the binary search method to detect the corrected common voltage Vcmc by which the threshold voltage Vb when the number of connections of variable capacitors is a2 becomes equal to a second voltage difference Vt2, while changing the voltage value of the common voltage Vcm to increase or decrease.

First, the correction circuit 32 outputs to the common voltage generator circuit 33 a control signal CONT12 indicative of a common voltage set value "16" as an initial value (S51 in FIG. 23). Here, as depicted in FIG. 17, the control signal CONT12 indicative of the common voltage set value "16" corresponds to the center value 600 mV of the variable range of the common voltage Vcm. By this, the common voltage generator circuit 33 generates a common voltage 600 mV on the basis of the control signal CONT12 indicative of the common voltage set value "16".

Next, similarly to the first embodiment as depicted in FIG. 18, the correction circuit 32 detects the number of connections a1 of variable capacitors by which the threshold voltage Vb becomes equal to the first voltage difference Vt1 (step S52 in FIG. 23).

After step S52, the correction circuit 32 sets the number of variable capacitors to be a1+ΔA=a2, that is, a value obtained by adding the reference value ΔA to the number of connections a1 detected in step S41, and also controls the differential voltage Vd to be the second voltage difference Vt2 (step S53 in FIG. 23). Then, the correction circuit 32 detects the output voltage VOP and decides whether or not the potential level of the output voltage VOP is L level (step S54 in FIG. 23).

If the potential level of the output voltage VOP is L level (Yes in step S54 in FIG. 23), the threshold voltage Vb when the number of connections of variable capacitors is a2 is lower than the second voltage difference Vt2 as depicted in FIG. 22. Therefore, the correction circuit 32 adds X3 to the common voltage set value of the control signal CONT12, to change the common voltage to increase (step S55 in FIG. 23). By this, the inclination of the variation line of the threshold voltage Vb increases.

If the potential level of the output voltage VOP is not L level (No in step S54 in FIG. 23), the threshold voltage Vb when the number of connections of variable capacitors is a2 is higher than the second voltage difference Vt2. Therefore, the correction circuit 32 subtracts X4 from the common voltage set value of the control signal CONT12, to change the common voltage to decrease (step S56 in FIG. 23). By this, the inclination of the variation line of the threshold voltage Vb decreases.

For example, when the potential level of the output voltage VOP is L level when the number of execution times n=0 (Yes in step S54 in FIG. 23), the correction circuit 32 outputs a control signal CONT12 indicative of a common voltage set value of "24" that is obtained by adding "8" to the common voltage set value "16" of the control signal CONT12, as depicted in FIG. 24 (step S55 in FIG. 23). By this, the common voltage generator circuit 33 generates a common voltage Vcm of 645 mV (FIG. 17).

On the other hand, when the potential level of the output voltage VOP is not L level when the number of execution times n=0 (No in step S54 in FIG. 23), the correction circuit 32 outputs a control signal CONT12 indicative of a common voltage set value of "8" that is obtained by subtracting "8" from the common voltage set value "16" of the control signal CONT12, as depicted in FIG. 24 (step S56 in FIG. 23). By this, the common voltage generator circuit 33 generates a common voltage Vcm of 560 mV (FIG. 17).

After step S55 or S56, when the number of execution times n=0 (No in step S57 in FIG. 23), the correction circuit 32 adds 1 to the number of execution times n, to obtain the number of execution times n=1 (step S58 in FIG. 23). Then, returning to step S52, the correction circuit 32 executes steps S52-S54 in a state that the common voltage Vcm is changed in step S55 or S56.

As such, based on the potential level of the output voltage VOP and the value of the execution times n, the correction circuit 32 adds X3 to or subtracts X4 from the common voltage set value of the control signal CONT12, to control the common voltage Vcm generated by the common voltage generator circuit 33.

Because the common voltage generator circuit 33 generates 32 kinds of common voltages Vcm on the basis of the control signal CONT12, the correction circuit 32, by repeating five times the operation of adding X3 and subtracting X4 depicted in FIG. 24, controls (detects) the common voltage Vcm to be a common voltage Vcmc by which the threshold voltage Vb when the number of connections of variable capacitors is a2 becomes equal to the second voltage difference, when the number of connections of variable capacitors is a2.

The correction circuit 32, after repeating steps S52-S57 five times (Yes in step S57 in FIG. 23), controls (detects) the common voltage Vcm at that time point to be a corrected common voltage Vcmc, and completes the correction operation depicted in FIG. 23. Among 32 kinds of controllable common voltages, the above controlled common voltage Vcm is a voltage nearest to the common voltage when the output voltage VOP is switched between H level and L level.

As having been described above, according to the second embodiment, the correction circuit 32 first controls the voltage difference Vd between the input voltages VIP and VIN to be a first voltage difference Vt1, and changes (by controlling) the capacitance values of the variable capacitors of the comparator circuit, to detect a first capacitance value Ct1 by which the potential level of the output voltage VOP of the comparator circuit is reversed (first correction operation). Next, the correction circuit 32 controls the variable capacitors to have a second capacitance value Ct2, which is a value obtained by adding a predetermined capacitance value difference ΔCt to a first capacitance value Ct1, controls the voltage difference Vd between the input voltage VIP and VIN to be a second voltage difference Vt2, and decide the potential level of the output voltage VOP (second correction operation). Then, the correction circuit 32 repeats the first and second correction operation until the common voltage Vcm is controlled to be a corrected common voltage Vcmc by which the potential level of the output voltage VOP is reversed.

In the second embodiment, the correction circuit 32 executes correction operation depicted in FIG. 21 for the comparator circuits COMP1, COMP2. However, it may also be possible to execute the correction operation depicted in FIG. 12 according to the first embodiment for one comparator circuit and execute the correction operation depicted in FIG. 21 for another comparator circuit. However, each predetermined voltage value difference ΔVt and each predetermined capacitance value difference ΔCt (reference value ΔA), at least the ratio ΔVt/ΔCt, are respectively set to be equal between in FIGS. 12 and 21. Thus, for example, the corrected comparator circuits COMP1, COMP2 are appropriately used for the flash AD converter 10 etc. depicted in FIG. 1, similar to the first embodiment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A comparator comprising:

a comparator circuit configured to output to an output terminal an output voltage based on a voltage difference between a first input voltage which is input to a first input terminal and a second input voltage which is input to a second input terminal;

a variable capacitor connected to the output terminal;

an input voltage control circuit configured to generate a common voltage to be added to the first and the second input voltages, to generate the first and the second input voltages including a differential voltage generated according to the common voltage; and a correction circuit configured to control the variable capacitor to control the common voltage, wherein the correction circuit controls a first capacitance value of the variable capacitor so that the potential of the output voltage is reversed when the voltage difference equals a first voltage difference, and controls a second capacitance value of the variable capacitor so that the potential of the output voltage is reversed when the voltage difference equals a second voltage value which is different from the first voltage difference by a predetermined voltage value, and controls the common voltage so that a difference between the first capacitance value and the second capacitance value becomes equal to a predetermined capacitance value.

2. The comparator according to claim 1, wherein the correction circuit sets capacitance of the variable capacitor to a capacitance value corresponding to a desired threshold voltage, on the basis of the first and the second voltage differences which are mutually different by the predetermined voltage value and the first and the second capacitance values which are mutually different by the predetermined capacitance value.

3. The comparator according to claim 1, wherein the correction circuit performs:

a first correction operation which controls the voltage difference to be the first voltage difference, and by variably controlling the capacitance value of the variable capacitor, controls the first capacitance value so that the potential of the output voltage is reversed; and a second correction operation which controls the voltage difference to be the second voltage difference, and by variably controlling the capacitance value of the variable capacitor, controls the second capacitance value so that the potential of the output voltage is reversed, and wherein, while changing the common voltage, the correction circuit repeats the first and the second correction operation until the difference between the first capacitance value and the second capacitance value becomes equal to the predetermined capacitance value.

4. The comparator according to claim 1, wherein the correction circuit performs:

a first correction operation which controls the voltage difference to be the first voltage difference and controls the first capacitance value by variably controlling the capacitance value of the variable capacitor so that the potential of the output voltage is reversed; and a second correction operation which controls the variable capacitor to be a second capacitance value which is obtained by adding the predetermined capacitance value to the first capacitance value, and detects whether or not the potential of the output voltage is reversed when the voltage difference is the second voltage difference, and in the second correction operation, while changing the common voltage, the correction circuit repeats the first and the second correction operation until the potential of the output voltage is reversed.

5. The comparator according to claim 1, wherein the input voltage control circuit includes:

a pair of input capacitors respectively connected to the first and the second input terminals; and a common voltage generator circuit which supplies the common voltage to the pair of input capacitors, and wherein the input voltage control circuit generates the first and the second input voltages by adding a positive-negative voltage difference to potential corresponding to the common voltage.

6. An AD converter comprising:

a plurality of comparators, each of the plurality of comparators including:

a comparator circuit configured to output to an output terminal an output voltage based on a voltage difference between a first input voltage which is input to a first input terminal and a second input voltage which is input to a second input terminal;

a variable capacitor connected to the output terminal;

an input voltage control circuit configured to generate a common voltage to be added to the first and the second input voltages, to generate the first and the second input voltages including a differential voltage generated according to the common voltage; and a correction circuit configured to control the variable capacitor to control the common voltage, wherein the correction circuit controls a first capacitance value of the variable capacitor so that the potential of the output voltage is reversed when the voltage difference equals a first voltage difference, and controls a second capacitance value of the variable capacitor so that the potential of the output voltage is reversed when the voltage difference equals a second voltage value which is different from the first voltage difference by a predetermined voltage value, and controls the common voltage so that a difference between the first capacitance value and the second capacitance value becomes equal to a predetermined capacitance value, wherein, to each of the plurality of comparators, the common voltage is set so that each inclination, which is a ratio of the predetermined voltage value to the predetermined capacitance value, becomes identical, and the variable capacitor is set to a capacitance value corresponding to a desired threshold voltage, on the basis of the first and the second voltage differences which are mutually different by the predetermined voltage value and the first and the second capacitance values which are mutually different by the predetermined capacitance value.

7. The comparator according to claim 1, wherein the predetermined capacitance value difference is half a maximum value of the capacitance value of the variable capacitor which is variably controllable by the correction circuit.

8. The comparator according to claim 3, wherein the correction circuit changes the common voltage to increase or decrease on the basis of the difference between the first capacitance value and the second capacitance value.

9. The comparator according to claim 3, wherein, in the first and the second correction operation, the correction circuit changes the capacitance value of the variable capacitor to increase or decrease on the basis of the potential of the output voltage, to control the first and the second capacitance values.

10. The comparator according to claim 4, wherein, in the first correction operation, the correction circuit changes the common voltage to increase or decrease on the basis of the potential of the output voltage.

11. The comparator according to claim 4, wherein the correction circuit changes the capacitance value of the variable capacitor to increase or decrease on the basis of the potential of the output voltage, to control the first capacitance value.

12. A correction method for a comparator circuit of which output terminal is connected to a variable capacitor and which is configured to output to an output terminal an output voltage based on a voltage difference between a first input voltage which is input to a first input terminal and a second voltage which is input to a second input terminal, the correction method comprising:

controlling a capacitance value of the variable capacitor;

controlling a common voltage to be added to the first and the second input voltages;

generating the first and the second input voltages including a differential voltage generated according to the common voltage; and performing a common voltage controlling to control a first capacitance value of the variable capacitor so that the potential of the output voltage is reversed when the voltage difference equals the first voltage difference, to control a second capacitance value of the variable capacitor so that the potential of the output voltage is reversed when the voltage difference equals a second voltage difference which is different from the first voltage difference by a predetermined voltage value, and to control the common voltage so that a difference between the first capacitance value and the second capacitance value becomes equal to a predetermined capacitance value.

13. The correction method according to claim 12, wherein the common voltage controlling includes performing a first correction to control the voltage difference to be the first voltage difference, and to by variably controlling the capacitance value of the variable capacitor, control the first capacitance value so that the potential of the output voltage is reversed;

performing a second correction to control the voltage difference to be the second voltage difference, and to by variably controlling the capacitance value of the variable capacitor, control the second capacitance value so that the potential of the output voltage is reversed; and performing by changing the common voltage, repeating the first correction and the second correction until the difference between the first capacitance value and the second capacitance value becomes equal to the predetermined capacitance value.

14. The correction method according to claim 12, wherein the common voltage controlling includes performing a first correction to control the voltage difference to be the first voltage difference, and to by variably controlling the capacitance value of the variable capacitor, control the first capacitance value so that the potential of the output voltage is reversed;

performing a second correction to control the variable capacitor to produce a second capacitance value which is obtained by adding the predetermined capacitance value to the first capacitance value, and to detect whether or not the potential of the output voltage is reversed when the voltage difference is the second voltage difference; and in the second correction, while changing the common voltage, repeating the first and the second correction until the potential of the output voltage is reversed.

15. The correction method according to claim 12, further comprising:

performing a threshold voltage setting to set capacitance of the variable capacitor to a capacitance value corresponding to a desired threshold voltage, on the basis of the first and the second voltage differences which are mutually different by the predetermined voltage value and the first and the second capacitance values which are mutually different by the predetermined capacitance value.

* * * * *